US012719493B2

(12) United States Patent
Betke et al.

(10) Patent No.: US 12,719,493 B2
(45) Date of Patent: Aug. 25, 2026

(54) AMPLITUDE-DRIVEN AT-SPEED CONTROL OF DIGITAL-TO-ANALOG CONVERTERS

(71) Applicant: International Business Machines Corporation, Armonk, NY (US)

(72) Inventors: Jarrett Betke, Hoffman Estates, IL (US); Timothy Lindquist, Rochester, MN (US); George Russell Zettles, IV, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 172 days.

(21) Appl. No.: 18/738,559

(22) Filed: Jun. 10, 2024

(65) Prior Publication Data

US 2025/0379590 A1 Dec. 11, 2025

(51) Int. Cl.
*H03M 1/66* (2006.01)
*H03K 3/037* (2006.01)

(52) U.S. Cl.
CPC .............. *H03M 1/66* (2013.01); *H03K 3/037* (2013.01)

(58) Field of Classification Search
CPC ................................. H03M 1/66; H03K 3/037
See application file for complete search history.

(56) References Cited

U.S. PATENT DOCUMENTS

| | | | | |
|---|---|---|---|---|
| 4,486,846 A | 12/1984 | McCallister et al. | | |
| 6,842,132 B2 | 1/2005 | Schafferer | | |
| 6,861,916 B2 | 3/2005 | Dally et al. | | |
| 7,268,825 B2 | 9/2007 | Ciardi | | |
| 8,791,849 B1 | 7/2014 | Marr et al. | | |
| 10,965,308 B1 * | 3/2021 | Gruber | ................ | H03M 1/0845 |
| 2013/0234871 A1 * | 9/2013 | Eliezer | ................ | H03M 1/1009 341/120 |
| 2021/0313973 A1 | 10/2021 | Cohen et al. | | |
| 2023/0274173 A1 | 8/2023 | Ofek et al. | | |

OTHER PUBLICATIONS

Analog Devises, "11-Bit/16-Bit, 12 GSPS, RF Digital-to-Analog Converters" Analog Devices, Inc., Data Sheet, https://www.analog.com/media/en/technical-documentation/data-sheets/AD9161-9162.pdf Last Accessed May 24, 2024, 144 pages.

(Continued)

*Primary Examiner* — Jean B Jeanglaude
(74) *Attorney, Agent, or Firm* — Amin, Turocy & Watson, LLP

(57) ABSTRACT

Systems and techniques that facilitate amplitude-driven at-speed control of digital-to-analog converters are provided. In various embodiments, a system can comprise a digital-to-analog converter that is configured to generate an analog waveform based on a digital amplitude indicator sequence. In various aspects, the system can comprise a processor that is configured to reset an operating characteristic of the digital-to-analog converter in response to detection of a defined digital amplitude indicator subsequence in the digital amplitude indicator sequence. In various instances, the operating characteristic can be operation of a numerically controlled oscillator of the digital-to-analog converter.

20 Claims, 11 Drawing Sheets

(56) References Cited

OTHER PUBLICATIONS

Lindquist, et al. "Configurable Qubit Electronics With Controlled Output Frequencies" U.S. Appl. No. 18/526,101, filed Dec. 1, 2023, 53 pages.
Lindquist, et al. "Configurable Qubit Electronics With Wide Output Range" U.S. Appl. No. 18/526,090, filed Dec. 1, 2023, 54 pages.
Non-Final Rejection Mailed on Jun. 12, 2026 for U.S. Appl. No. 18/526,090, 13 page(s).

* cited by examiner

400

402

404 GENERATE ALERT SIGNALING THAT DEFINED DIGITAL AMPLITUDE INDICATOR SUBSEQUENCE 302 IS NOT DETECTED

406 INITIALIZE $i = 1$

408 PROCEED TO NEXT TIME-STEP

410 ACCESS CURRENT DIGITAL AMPLITUDE INDICATOR IN DIGITAL AMPLITUDE INDICATOR SEQUENCE 106

412 DOES CURRENT DIGITAL AMPLITUDE INDICATOR MATCH DIGITAL AMPLITUDE INDICATOR 302($i$)?

N

Y

414 $i == N$ ?

Y

N

416 INCREMENT $i$

418 GENERATE ALERT SIGNALING THAT DEFINED DIGITAL AMPLITUDE INDICATOR SUBSEQUENCE 302 IS DETECTED

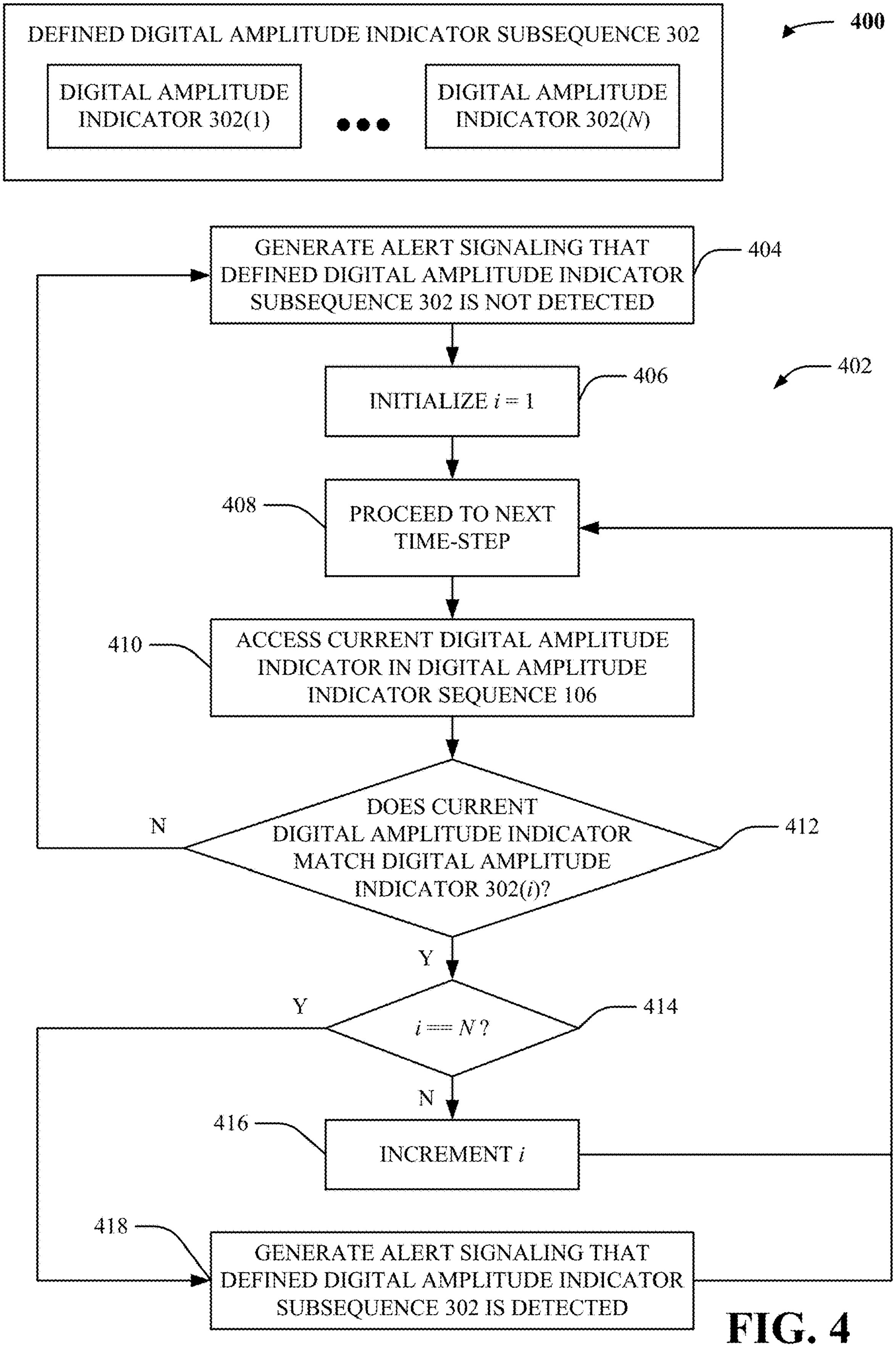

FIELD PROGRAMMABLE GATE ARRAY 602

AMPLITUDE-DRIVEN CONTROL SYSTEM 102

NUMERICALLY CONTROLLED OSCILLATOR 606

WAVEFORM MIXER 610

ANALOG CORE 614

QUANTUM COMPUTER 616

QUBITS 618

604

608

612

104

108

800

BASEBAND WAVEFORM 604

INTERNAL WAVEFORM 608 WITHOUT AMPLITUDE-DRIVEN CONDITIONAL RESET

CLOCK CYCLE A

CLOCK CYCLE B

CLOCK CYCLE C

CLOCK CYCLE D

CLOCK CYCLE E

CLOCK CYCLE F

900

BASEBAND WAVEFORM 604

INTERNAL WAVEFORM 608 WITH AMPLITUDE-DRIVEN CONDITIONAL RESET

CLOCK CYCLE A

CLOCK CYCLE B

CLOCK CYCLE C

CLOCK CYCLE D

CLOCK CYCLE E

CLOCK CYCLE F

902

904

1000

GENERATING, BY A DIGITAL-TO-ANALOG CONVERTER, AN ANALOG WAVEFORM BASED ON A DIGITAL AMPLITUDE INDICATOR SEQUENCE

1002

RESETTING, BY A PROCESSOR COUPLED TO THE DIGITAL-TO-ANALOG CONVERTER, AN OPERATING CHARACTERISTIC OF THE DIGITAL-TO-ANALOG CONVERTER IN RESPONSE TO DETECTION OF A DEFINED DIGITAL AMPLITUDE INDICATOR SUBSEQUENCE IN THE DIGITAL AMPLITUDE INDICATOR SEQUENCE

1004

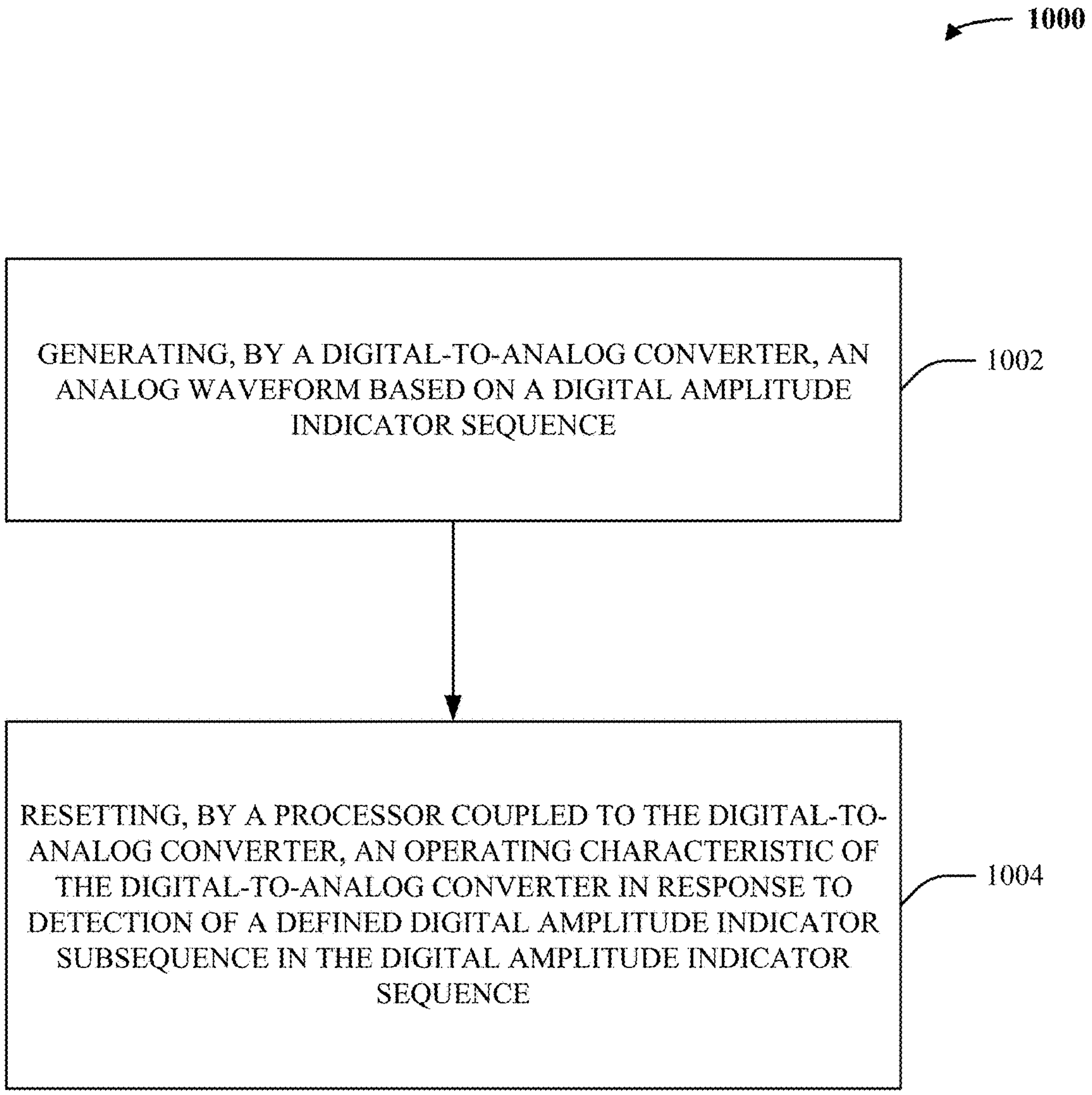

FIG. 10

AMPLITUDE-DRIVEN AT-SPEED CONTROL OF DIGITAL-TO-ANALOG CONVERTERS

BACKGROUND

The subject disclosure relates to digital-to-analog converters, and more specifically to amplitude-driven at-speed control of digital-to-analog converters.

SUMMARY

The following presents a summary to provide a basic understanding of one or more embodiments. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, or apparatuses that can facilitate amplitude-driven at-speed control of digital-to-analog converters are described.

According to one or more embodiments, a system is provided. In various aspects, the system can comprise a digital-to-analog converter that is configured to generate an analog waveform based on a digital amplitude indicator sequence. In various instances, the system can comprise a processor that is configured to reset an operating characteristic of the digital-to-analog converter in response to detection of a defined digital amplitude indicator subsequence in the digital amplitude indicator sequence. In various cases, the operating characteristic can be operation of a numerically controlled oscillator of the digital-to-analog converter.

In various aspects, the above-described systems can be implemented as computer-implemented methods or as computer program products.

DESCRIPTION OF THE DRAWINGS

FIG. 4 illustrates an example, non-limiting block diagram showing how a defined digital amplitude indicator subsequence can be detected in accordance with one or more embodiments described herein.

FIG. 10 illustrates a flow diagram of an example, non-limiting computer-implemented method that facilitates amplitude-driven at-speed control of digital-to-analog converters in accordance with one or more embodiments described herein.

DETAILED DESCRIPTION

Figure 1:
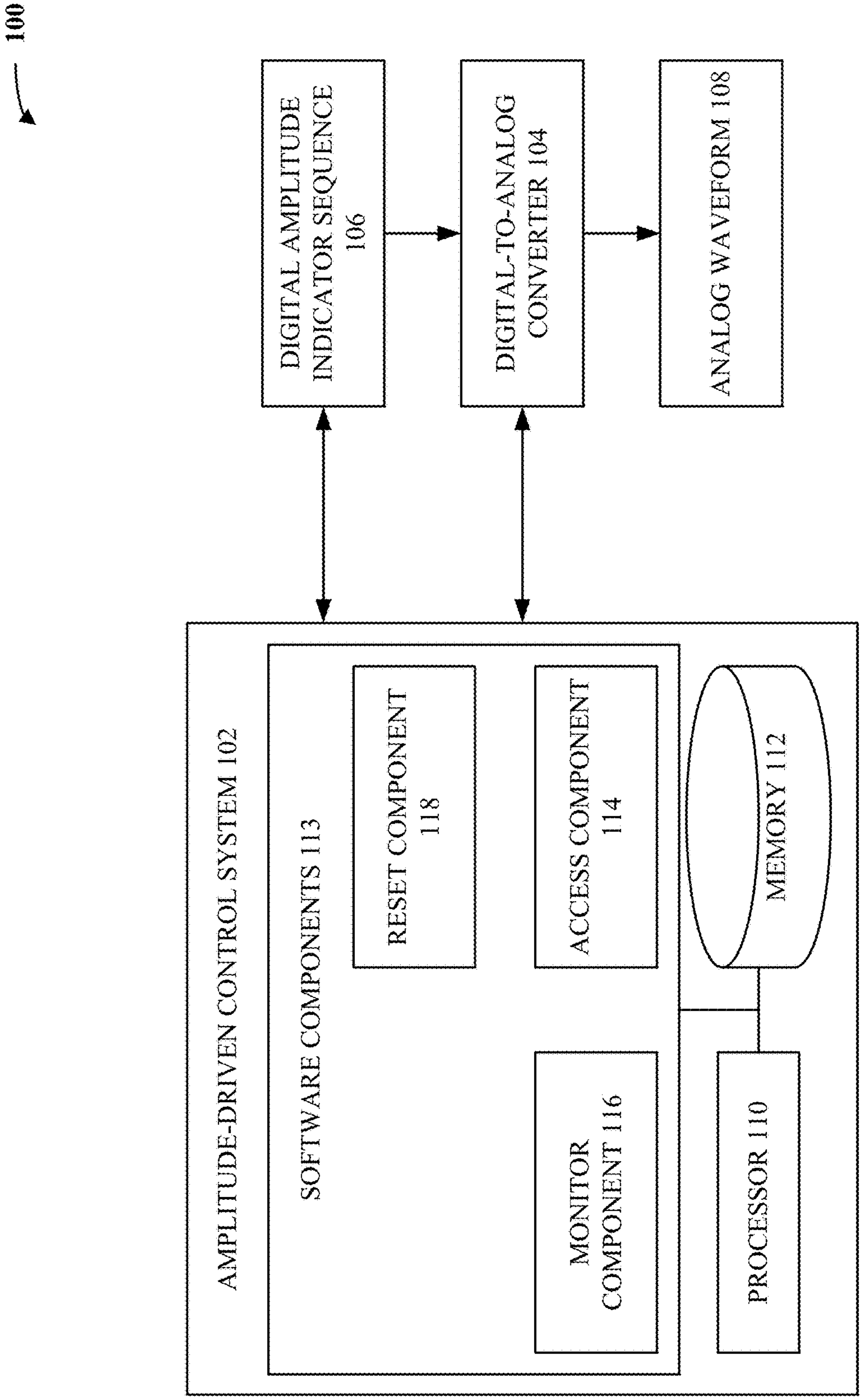
FIG. 1 illustrates a block diagram of an example, non-limiting system that facilitates amplitude-driven at-speed control of digital-to-analog converters in accordance with one or more embodiments described herein.

The following detailed description is merely illustrative and is not intended to limit embodiments or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Various operational contexts can involve, necessitate, or otherwise require the generation or reproduction of high-frequency waveforms (e.g., sinusoidally oscillating signals with frequencies in the gigahertz (GHz) range). As a non-limiting example, the operational context of quantum computing can involve exposing a qubit (e.g., a superconducting qubit such as a transmon) to a waveform whose frequency matches an excitation or transition frequency of the qubit (e.g., such excitation or transition frequency might be about or near 5 GHz), thereby causing the qubit to undergo a quantum operation or state change (e.g., a Pauli operation, a Hadamard operation). In order to accomplish such generation or reproduction of high-frequency waveforms, additive or multiplicative mixing of lower-frequency or baseband waveforms (e.g., sinusoidally oscillating signals with frequencies in the megahertz (MHz) range or kilohertz (kHz) range) via a digital-to-analog converter (DAC) can be implemented. In particular, a DAC can receive a digital representation of any suitable baseband waveform; the DAC can mix the digital representation of the baseband waveform with a digital representation of any other suitable waveform produced internally by the DAC; and the result of such mixing can be passed through any suitable analog core (e.g., ladder core) of the DAC, thereby yielding a mixed analog waveform whose characteristics (e.g., frequency, phase) depend upon those of the baseband waveform and of the internally-generated waveform. Accordingly, the mixed analog waveform can be forced to have any given or desired frequency or phase, by commensurately controlling the frequencies or phases of the baseband waveform or of the internally-generated waveform.

The baseband waveform is often generated by a field programmable gate array (FPGA), which can allow for precisely-timed control of frequency or phase of the baseband waveform. However, the internally waveform is often produced by a numerically controlled oscillator (NCO) of the DAC. Unfortunately, existing techniques for implementing the NCO of the DAC do not allow for precisely-timed control of frequency or phase of the internally waveform.

In particular, some existing techniques involve manually selecting a single internal waveform to be continuously implemented by the NCO of the DAC for the duration or entirety of any given waveform-generation session. After all, at least in the operational context of quantum computing, it can be desired to generate or reproduce different mixed waveforms at different times during such session, with each mixed waveform lasting only on the order of mere milliseconds or microseconds, and it can be practically impossible for the controllable parameters of the NCO to be precisely manually adjusted by an operator or user during or otherwise for those millisecond or microsecond intervals. In other words, such existing techniques do not allow at-speed control or real-time control of the characteristics of the internal waveform. So, some existing techniques attempt to address this impracticality (e.g., attempt to deal with this lack of at-speed or real-time control) by causing the NCO to continuously produce an unchanging and uninterrupted internal waveform for the entire duration of the session. In such existing techniques, the characteristics of the internal waveform can be manually selected at the start of the session and can be considered as constant throughout the session, and the characteristics of the mixed waveform at different times can accordingly be controlled by commensurately controlling or adjusting the characteristics of only the baseband waveform.

Unfortunately, however, such existing techniques suffer from a frequency-restriction disadvantage, as recognized by the present inventors of various embodiments described herein. Specifically, such existing techniques function properly only when the frequency implemented by the NCO of the DAC is an integer multiple of a clock frequency of the DAC. Without such integer multiple relationship in place, the internal waveform will have a shifting or otherwise non-constant phase with respect to the clock cycle of the DAC, notwithstanding the NCO making no active changes or alterations to the characteristics of the internal waveform. Thus, when the frequency of the NCO is not an integer multiple of the clock frequency, the internal waveform can, during certain clock cycles, be considered as being mistimed or otherwise out-of-phase with the baseband waveform, which can cause commensurate mistiming of the mixed waveform. Such mistiming can be highly disadvantageous. Although such mistiming can be avoided by implementing an NCO frequency that is an integer multiple of the clock frequency, such integer multiple restriction renders very many potentially useful or desirable frequencies as off-limits for the NCO. Indeed, in the operational context of quantum computing, avoidance of frequency collisions can be facilitated by configuring each qubit to have its own, unique excitation or transition frequency. So, by restricting the number of possible frequencies that can be implemented by the NCO, the total number of qubits that can be implemented on any given quantum computer can thus be reduced, which can be undesirable.

Other existing techniques attempt to rectify these issues by constructing or configuring the DAC to reset the NCO upon receipt of a reset key. In particular, such other existing techniques can involve configuring the DAC to receive as input not just the digital representation of the baseband waveform, but also a distinct bit-string that is separate from the digital representation of the baseband waveform and that serves as a dedicated reset command or reset signal. In such other existing techniques, the NCO can continuously generate the internal waveform for the duration or entirety of any given waveform-generation session. Upon receipt of the reset key, the DAC can cause the NCO to restart or reboot, which can commensurately cause the phase of the internal waveform to be re-initialized so as to again be in-time or synchronized (at least temporarily) with the clock cycle of the DAC. Accordingly, in such other existing techniques, the reset key can be armed so as to be sent or transmitted at specific times (e.g., can be synchronized so as to be sent at times when the characteristics of the baseband waveform are desired or planned to be changed).

Although such other existing techniques do allow the NCO to use frequencies that are not integer multiples of the clock cycle, such other existing techniques nevertheless have their own disadvantages, as recognized by the present inventors. Specifically, such other existing techniques can be considered as causing discontinuities in the mixed waveform produced by the DAC or as otherwise wasting communication bandwidth of the DAC. Indeed, the DAC is often configured to serially receive, across clock cycles, digital representations of one or more amplitudes of the baseband waveform and to convert those digital representations into commensurate analog amplitudes. If a dedicated or standalone reset key is present, it can be considered as an interruption or discontinuity in that series of received digital amplitude representations. In other words, any time-step or clock cycle in which the dedicated or standalone reset key is received by the DAC can be considered as a time-step or clock cycle in which at least one fewer digital amplitude representation is received and converted by the DAC than expected or than otherwise possible. Thus, the inclusion of the dedicated or standalone reset key can be considered as equivalent to the exclusion of at least some digital amplitude representations, and such exclusion can manifest as gaps, discontinuities, or poor resolution in the mixed waveform produced by the DAC.

Yet other existing techniques attempt to rectify these issues by performing complicated manipulations of the clock cycle of the DAC. Unfortunately, such clock manipulation can introduce heightened complexities and inconsistencies.

Accordingly, existing techniques can be considered as suffering from various technical problems.

Various embodiments described herein can ameliorate or address one or more of such technical problems. Various embodiments described herein can include systems, computer-implemented methods, apparatus, or computer program products that can facilitate amplitude-driven at-speed control of DACs. In particular, the present inventors realized that, rather than relying on a separate bit-string to serve as a dedicated reset key, at-speed control of a DAC can be achieved by instead conditioning or driving reset on the detection of any suitable defined subsequence in the digital amplitude representations that are serially received by the DAC. In other words, the present inventors devised various techniques in which a portion of the stream or sequence of digital amplitude representations can itself be treated or interpreted as a reset command or reset indicator, such that the stream or sequence of digital amplitude representations need not be interrupted or rendered discontinuous by a dedicated or standalone reset key. In still other words, the stream or sequence of digital amplitude representations can be considered as having dual or twin purposes or functions: a first purpose or function can be to indicate instantaneous amplitudes of the baseband waveform; and a second purpose or function can be to indicate whether or not an NCO reset should occur. By conditioning reset of the DAC on amplitude data rather than on dedicated reset keys, at-speed control of the DAC can be achieved without the discontinuities or wasted communication bandwidth of existing techniques.

Various embodiments described herein can be considered as a computerized tool (e.g., any suitable combination of computer-executable hardware or computer-executable software) that can facilitate amplitude-driven at-speed control of digital-to-analog converters. In various aspects, such a computerized tool can comprise an access component, a monitor component, or a reset component.

In various embodiments, there can be a DAC. In various aspects, the DAC can exhibit any suitable construction, architecture, configuration, or design, so as to be able to convert digital waveforms into corresponding analog waveforms. As some non-limiting examples, the DAC can exhibit or otherwise be made up of: any suitable digital interface or serial receiver; any suitable decoder or control logic circuit; any suitable reference voltage or current electrode; any suitable analog core, such as a resistor network or switch array; or any suitable op-amps or filters that are downstream of the analog core.

In various instances, there can be a digital amplitude indicator sequence. In various cases, the digital amplitude indicator sequence can be a continuously, continually, or otherwise regularly growing or advancing timeseries of digital amplitude indicators. That is, one or more new, current-time, or present-time digital amplitude indicators can be added to the digital amplitude indicator sequence at each time-step or clock cycle. In various aspects, each digital amplitude indicator can be any suitable bit-string indicating or otherwise representing a respective instantaneous amplitude value that is to be converted by the DAC.

In various aspects, the DAC can electronically generate an analog waveform, based on the digital amplitude indicator sequence. More specifically, at each particular time-step or clock cycle, the DAC can receive or access one or more digital amplitude indicators (e.g., the one or more that were added in that particular time-step or clock cycle) from the digital amplitude indicator sequence, the DAC can accordingly convert those one or more received or accessed digital amplitude indicators into corresponding continuously-varying amplitudes (e.g., voltage amplitudes or current amplitudes), and those continuously-varying amplitudes can be considered as collectively forming or being the analog waveform. In other words, those one or more received or accessed digital amplitude indicators can pass through whatever circuitry (e.g., through whatever interface, decoder, resistor network, switch array, op-amps, or filters) that makes up the DAC, and the result of such pass-through can be considered or referred to as the analog waveform. Accordingly, the characteristics (e.g., frequency, phase, amplitude) of the analog waveform can depend or otherwise be based on the digital amplitude indicator sequence (e.g., can depend upon how quickly or slowly the amplitude values conveyed by the digital amplitude indicator sequence rise or fall over time).

In various embodiments, the access component of the computerized tool can electronically access the digital amplitude indicator sequence. For instance, the access component can receive, retrieve, or otherwise obtain the digital amplitude indicator sequence from any suitable centralized or decentralized data structures (e.g., graph data structures, relational data structures, hybrid data structures), whether local to or remote from the access component. Likewise, the access component can electronically access the DAC. For instance, the access component can electronically interface or communicate with (e.g., send electronic commands to, read electronic signals from) the DAC. In any case, the access component can be considered as a conduit through which other components of the computerized tool can electronically interact with (e.g., read, write, edit, copy, manipulate, execute, activate, deactivate, power-up, power-down, modify) the digital amplitude indicator sequence or the DAC.

In various embodiments, the monitor component of the computerized tool can electronically monitor the digital amplitude indicator sequence for a defined digital amplitude indicator subsequence. In other words, the monitor component can electronically read the digital amplitude indicator sequence over time in search of the defined digital amplitude indicator subsequence. In various aspects, the defined digital amplitude indicator subsequence can be a contiguous or uninterrupted chain of any suitable defined, known, or otherwise desired digital amplitude indicators.

As a non-limiting example, the defined digital amplitude indicator subsequence can be a contiguous chain of three zero-amplitude indicators. In such case, the monitor component can be considered as continuously, continually, or otherwise regularly reading whatever new digital amplitude indicators are added to the digital amplitude indicator sequence at each new time-step or clock cycle, in search of any three consecutive digital amplitude indicators that each convey an amplitude value of zero. Recall that a sinusoidally oscillating waveform can periodically exhibit an isolated or lone amplitude of zero each time the waveform crosses its temporal axis. So, if there are three temporally-consecutive amplitudes of zero, this can indicate that the waveform is no longer sinusoidally oscillating and is instead idling or flatlining at zero. Accordingly, if the defined digital amplitude subsequence is a chain of three zero-amplitude indicators, the monitor component can be considered as searching or looking for a time interval during which whatever waveform that the DAC is supposed to be converting is now idle.

However, this is a mere non-limiting example. In other cases, the defined digital amplitude indicator subsequence can be of any other length (e.g., can contain more than three defined digital amplitude indicators). In some cases, the defined digital amplitude indicator subsequence can contain indicators that correspond to any suitable non-zero amplitude (e.g., can contain indicators that correspond to a maximum or most positive amplitude, to a minimum or most negative amplitude, or to any other suitable intermediate amplitudes). In various cases, different indicators in the defined digital amplitude indicator subsequence can correspond to or otherwise convey the same or different amplitudes as each other (e.g., the defined digital amplitude indicator subsequence can contain some zero-amplitude indicators and some non-zero amplitude indicators arranged in any suitable order with respect to each other).

In any case, the monitor component can be considered as regularly reading whatever new digital amplitude indicators are being received or fed to the DAC, so as to locate the defined digital amplitude indicator subsequence. Until the monitor component identifies or detects the defined digital amplitude indicator subsequence, the monitor component can generate any suitable electronic alert or notification indicating that the defined digital amplitude indicator subsequence is not found, and the monitor component can continue to read or monitor the digital amplitude indicator sequence. However, upon identifying or detecting the defined digital amplitude indicator subsequence, the monitor component can instead generate any suitable electronic alert or notification indicating that the defined digital amplitude indicator subsequence is found. Note that, in some cases, the monitor component can continue or resume reading or monitoring the digital amplitude indicator sequence after determining that the defined digital amplitude indicator subsequence is found. For instance, the monitor component can continue to search for the last, final, or most recent digital amplitude indicator that is present in the defined digital amplitude indicator subsequence. If each new digital amplitude indicator matches the last, final, or most recent one of the defined digital amplitude indicator subsequence, the monitor component can determine that the defined digital amplitude indicator subsequence is still found and can generate an electronic alert accordingly. However, once any new digital amplitude indicator fails to match the last, final, or most recent one of the defined digital amplitude indicator subsequence, the monitor component can instead determine that the defined digital amplitude indicator subsequence is no longer found and can generate an electronic alert accordingly.

In various embodiments, the reset component of the computerized tool can electronically adjust, manipulate, or otherwise influence any suitable operational characteristic of the DAC, based on whatever determination is made by the monitor component. In various aspects, the operational characteristic can be any suitable technical aspect, feature, or detail of the DAC that is configurable or otherwise selectively controllable. As some non-limiting examples, the operational characteristic can be operation of an NCO of the DAC, operation of an analog core of the DAC, or operation of a downstream filter or amplifier of the DAC. In any case, the operational characteristic can be considered as being able to take on or otherwise occupy one of two possible states at any given time: a normal operating state in which the operational characteristic functions as expected; and a conditional reset state in which the operational characteristic is paused, idled, powered-off, or frozen (e.g., accordingly, the conditional reset state can alternatively be referred to as a conditional idle state, a conditional sleep state, or a conditional off state). In various instances, in response to the monitor component not yet finding or detecting the defined digital amplitude indicator subsequence, the reset component can cause the operational characteristic of the DAC to be placed into the normal operating state. Note that, if the operational characteristic is already in the normal operating state at a time-step or clock cycle in which the defined digital amplitude indicator subsequence is not found, the reset component need not do anything. In contrast, in response to the monitor component finding or detecting the defined digital amplitude indicator subsequence, the reset component can instead cause the operational characteristic of the DAC to be placed into the conditional reset state. As above, note that, if the operational characteristic is already in the conditional reset state at a time-step or clock cycle in which the defined digital amplitude indicator subsequence is found, the reset component need not do anything. Furthermore, note that the term "conditional" can be considered as appropriate, since the conditional reset state can be conditioned on detection of the defined digital amplitude indicator subsequence. In various cases, the reset component can shift the operational characteristic into the conditional reset state by shutting-off, powering-down, or otherwise causing the operational characteristic to become inactive. Conversely, the reset component can shift the operational characteristic into the normal operating state by turning-on, powering-up, or otherwise causing the operational characteristic to become active.

In any case, the reset component can place the operational characteristic of the DAC into the conditional reset state in response to detection of the defined digital amplitude indicator subsequence, and the reset component can instead place the operational characteristic of the DAC into the normal operating state otherwise. Such conditional resetting can be beneficial since it can keep the DAC's functionality or operation fresh, timely, or otherwise synchronized with the digital amplitude indicator sequence. For clarification, consider the following non-limiting example.

Suppose that the DAC is coupled to a quantum computer. The quantum computer can be any suitable device that utilizes a qubit lattice (e.g., a plurality of superconducting qubits fabricated on one or more quantum substrates and exhibiting any suitable connection topology) for information processing. In particular, it can be desired to drive any given qubit of the quantum computer with the analog waveform that is produced by the DAC. In various aspects, such driving can cause the given qubit to undergo any suitable quantum operation (also referred to as a quantum gate), where the specific quantum operation performed on the given qubit (e.g., Pauli-X gate versus Pauli-Y gate, Controlled-NOT gate versus Hadamard gate) can be determined or dictated by the frequency or phase of the analog waveform. Accordingly, the given qubit can undergo a first quantum operation in response to the analog waveform having a first frequency or phase at a first time, and the given qubit can subsequently undergo a second quantum operation in response to the analog waveform having a second frequency or phase at a second time. In various aspects, the digital amplitude indicator sequence can represent a baseband waveform produced by an FPGA that is coupled upstream of the DAC, and the DAC can generate the analog waveform by multiplicatively mixing the baseband waveform with an internal waveform produced by an NCO of the DAC. Accordingly, the frequency or phase of the internal waveform produced by the NCO can be selectively set to any suitable constant values, and the frequency or phase of the baseband waveform produced by the FPGA can be selectively controlled over time, so that the analog waveform achieves desired frequencies or phases at desired times, thereby causing the given qubit to undergo desired quantum operations at those desired times.

Now, in such cases, operation of the NCO can be considered or otherwise treated as the operational characteristic of the DAC. For purposes of this non-limiting example, suppose that the defined digital amplitude indicator subsequence is a chain of zero-amplitude indicators of length 3. Accordingly, the NCO can be conditionally resettable by the reset component, in response to the baseband waveform having three successive or consecutive amplitudes of zero. In other words, any instant in time at which the baseband waveform has a non-zero amplitude can be considered as an instant in time at which the reset component causes the NCO to be operating normally (e.g., to be producing the internal waveform according to whatever constant frequency or phase has been selected), whereas any instant in time at which the baseband waveform has an amplitude of zero immediately preceded by at least two other amplitudes of zero can be considered as an instant in time at which the reset component causes the NCO to cease or pause operation (e.g., such that the internal waveform is now all zero). In still other words, the baseband waveform can be considered as idling at any instant in time at which its present and two preceding amplitudes are zero, the baseband waveform can be considered as not idling at any other instant in time, and the reset component can cause the NCO to be active only at instants in time at which the baseband waveform is not idling.

In any case, such conditional resetting of the NCO can be considered as causing the internal waveform to remain synchronized with non-idle intervals of the baseband waveform, even in situations where the frequency of the internal waveform is not an integer multiple of the clock cycle of the DAC. Indeed, when the NCO shifts from the conditional reset state to the normal operating state at any given instant in time, the internal waveform can be considered as restarting anew at that given instant in time. Thus, whenever a non-idle interval of the baseband waveform immediately follows an idle-interval of the baseband waveform, the internal waveform can be considered as being freshly restarted from the beginning of its period at whatever moment at which the non-idle interval commences. Accordingly, the non-idle interval of the baseband waveform and the internal waveform can have whatever synchronized or in-phase relationship is expected or desired, which means that the analog waveform produced by the DAC can have whatever frequency or phase is expected or desired, which in turn means that the given qubit can undergo whatever quantum operation is expected or desired. In stark contrast, if conditional resetting were not implemented as described herein, the internal waveform would be continuously or continually running throughout both the idle and non-idle intervals of the baseband waveform, such that the internal waveform would be likely to be somewhere in the middle of its period at whatever moment at which the non-idle interval of the baseband waveform commences. This would cause the non-idle interval of the baseband waveform and the internal waveform to have some non-synchronized or out-of-phase relationship that is unexpected or undesired, which would mean that the analog waveform produced by the DAC would have some unexpected or undesired phase, which in turn would mean that the given qubit would undergo some unexpected or undesired quantum operation.

Moreover, making such resetting of the NCO conditional upon the content of the digital amplitude indicator sequence (e.g., making reset of the NCO be driven by incoming amplitude values) can be considered as avoiding discontinuities and waste of communication channels. Indeed, at each time-step or clock cycle, the DAC can be considered as converting (e.g., via mixing with the internal waveform produced by the NCO) one or more digital amplitude indicators into one or more corresponding continuously-varying amplitudes of the analog waveform. Because the NCO can be shifted to the conditional reset state in response to the DAC receiving three or more consecutive amplitudes of zero, the incoming digital amplitude indicators can, in some cases, be considered as being uninterrupted or gapless. In stark contrast, if the NCO were to instead be reset in response to the DAC receiving a dedicated or standalone reset key, that dedicated or standalone reset key would take up some available communication space, channel, or bandwidth that would or could otherwise have been occupied by one or more digital amplitude indicators. Accordingly, the sequence or stream of digital amplitude indicators received by the DAC would be interrupted or would otherwise have gaps or discontinuities caused by those inserted reset keys, and such interruptions, gaps, or discontinuities would cause the DAC to process or convert fewer digital amplitude indicators at any given time.

Various embodiments described herein can be employed to use hardware or software to solve problems that are highly technical in nature (e.g., to facilitate amplitude-driven at-speed control of digital-to-analog converters), that are not abstract and that cannot be performed as a set of mental acts by a human. Further, some of the processes performed can be performed by a specialized computer (e.g., digital-to-analog converters, numerically controlled oscillators, field programmable gate arrays, quantum computers comprising tangible qubits that can execute or implement quantum circuits).

In various aspects, some defined tasks associated with various embodiments described herein can include: generating, by a digital-to-analog converter, an analog waveform based on a digital amplitude indicator sequence; and resetting, by a processor coupled to the digital-to-analog converter, an operating characteristic of the digital-to-analog converter in response to detection of a defined digital amplitude indicator subsequence in the digital amplitude indicator sequence. In various instances, the operating characteristic can be operation of a numerically controlled oscillator of the digital-to-analog converter. In various cases, the digital amplitude indicator sequence can correspond to a baseband waveform produced by a field programmable gate array. In various aspects, the digital-to-analog converter can mix the baseband waveform with an internal waveform produced by the numerically controlled oscillator, and a core of the digital-to-analog converter can compute the analog waveform based on a result of such mixing. In various instances, resetting the operation of the numerically controlled oscillator in response to detection of the defined digital amplitude indicator subsequence can cause a phase of the analog waveform to be synchronized with the baseband waveform, regardless of a frequency implemented by the numerically controlled oscillator. In various cases, such defined tasks can include: transmitting, by the digital-to-analog converter, the analog waveform to a qubit of a quantum computer, thereby causing the qubit to perform a quantum operation. In various aspects, a frequency implemented by the numerically controlled oscillator can be not an integer multiple of a clock frequency associated with the digital-to-analog converter. In various instances, the defined digital amplitude indicator subsequence can be a threshold number of consecutive zero-amplitude indicators produced by the field programmable gate array.

Such defined tasks are inherently computerized. Indeed, neither the human mind nor a human with pen and paper can: electronically convert, via a DAC, a stream of digital amplitude indicators produced by an FPGA into an analog waveform; electronically reset an operational characteristic (such as an NCO) of the DAC in response to detection of a defined digital amplitude indicator subsequence in the stream of digital amplitude indicators; and electronically drive a qubit of a quantum computer with the analog waveform. Indeed, DACs, NCOs, and FPGAs are specific configurations of computerized hardware and circuitry that cannot be implemented or facilitated in any way whatsoever in the human mind or by a human with mere pen and paper. Likewise, a quantum computer is a specialized piece of computing hardware that utilizes physical qubits (e.g., superconducting qubits, such as transmons) to process information. Therefore, various embodiments described herein are inherently computerized and cannot be implemented in any sensible, practicable, or reasonable way without computers.

In various instances, one or more embodiments described herein can integrate the herein-described teachings into a practical application. As mentioned above, a DAC can generate an analog waveform by mixing a baseband waveform with an internally-generated waveform. The baseband waveform is often generated by an FPGA, which allows for precisely-timed control of the frequency or phase of the baseband waveform. In contrast, the internal waveform is often produced by an NCO of the DAC. According to some existing techniques, the NCO's frequency or phase can be manually selected prior to the start of a waveform-generation session, but cannot practicably be altered during the session (e.g., it can be desired to change or alter the analog waveform's characteristics multiple times in the span of mere microseconds or milliseconds, and the NCO's parameters cannot practicably be manually changed at such high speeds). Such existing techniques involve limiting the NCO only to frequencies that are integer multiples of a clock cycle of the DAC, so as to maintain synchronization between the baseband waveform and the internal waveform. Unfortunately, such frequency limitation can be considered as undesirable (e.g., the number of qubits driven by the DAC could be increased if the NCO were not limited to frequencies that are integer multiples of the clock cycle). Other existing techniques attempt to circumvent this frequency limitation problem by utilizing dedicated reset keys. In such other existing techniques, the DAC can receive not just digital representations of the baseband waveform, but also a bit-string that indicates or represents a reset command rather than a baseband amplitude value (e.g., whenever the DAC receives the reset bit-string, the DAC can reset its NCO, so as to (at least temporarily) rectify any asynchronicity between the baseband waveform and the internal waveform). Unfortunately, the use of dedicated reset keys can be considered as causing data discontinuities or as otherwise wasting communication bandwidth of the DAC (e.g., a dedicated reset key takes up communication space that otherwise would or could have been filled with one or more baseband amplitude values; so, when dedicated reset keys are implemented, the DAC processes fewer baseband amplitude values in any given unit of time than it otherwise could have processed). Yet other existing techniques attempt to circumvent these issues by manipulating the clock cycle. Unfortunately, such yet other existing techniques introduce significant complexity and inconsistency.

Various embodiments described herein can address, reduce, or otherwise ameliorate one or more of these technical problems that plague existing techniques. Indeed, various embodiments described herein can involve configuring the DAC to receive a stream or sequence of baseband amplitude values, and configuring the DAC to reset its NCO in response to detection of any suitable defined amplitude value subsequence in the stream or sequence of baseband amplitude values. In other words, the present inventors realized that a defined sequence or pattern of baseband amplitude values (e.g., a consecutive chain of baseband amplitudes of zero magnitude) can itself serve as a type of pseudo reset key that takes up no additional space in the communication bandwidth of the DAC. In this way, mid-session (e.g., at-speed, real-time) resets of the NCO can be achieved such that the NCO need not be limited only to frequencies that are integer multiples of the clock cycle, and yet the concomitant problems of dedicated reset keys or clock cycle manipulation can nevertheless be avoided.

Moreover, note that various embodiments described herein can be considered as highly counter-intuitive. Indeed, as mentioned above, various embodiments described herein can involve conditioning the reset of an operational characteristic (e.g., NCO) of a DAC on the detection of a defined digital amplitude indicator subsequence within a stream or time-series of digital amplitude indicators received as input by the DAC. In other words, various embodiments described herein can drive reset of the operational characteristic based on detection of a specific amplitude pattern exhibited by the DAC's incoming amplitude values. To interpret incoming amplitude values as conveying or representing non-amplitude information (e.g., whether or not to reset) as described herein can be considered as a clever, counter-intuitive technique that, despite its seeming self-contradiction, can achieve at-speed or mid-session control of DACs without the attendant shortcomings of existing techniques.

For at least the above reasons, various embodiments described herein can be considered as clever or innovative techniques that address or ameliorate various problems or disadvantages of existing techniques. Therefore, various embodiments described herein can be considered as a concrete and tangible technical improvement in the field of digital-to-analog converters. Accordingly, various embodiments described herein certainly qualify as useful and practical applications of computers.

Furthermore, various embodiments described herein can control real-world tangible devices based on the disclosed teachings. For example, various embodiments described herein can electronically activate, deactivate, reboot, or reset real-world hardware or circuitry (e.g., an NCO of a DAC).

It should be appreciated that the figures and the herein disclosure describe non-limiting examples of various embodiments. It should further be appreciated that the figures are not necessarily drawn to scale.

FIG. 1 illustrates a block diagram of an example, non-limiting system 100 that can facilitate amplitude-driven at-speed control of digital-to-analog converters in accordance with one or more embodiments described herein. As shown, an amplitude-driven control system 102 can be electronically integrated, via any suitable wired or wireless electronic connections, with a digital-to-analog converter 104 (hereafter "DAC 104") or with a digital amplitude indicator sequence 106.

In various embodiments, the DAC 104 can exhibit any suitable digital-to-analog conversion architecture, construction, or design. As a non-limiting example, the DAC 104 can comprise any suitable digital input interface circuitry which can receive any suitable digital input signal that is to be converted by the DAC 104. For instance, such digital input interface circuitry can be universal serial bus (USB) circuitry, Sony/Philips digital interface format (S/PDIF) circuitry, high-definition multimedia interface (HDMI) circuitry, Ethernet® circuitry, Bluetooth® circuitry, or Wireless Fidelity (Wi-Fi) circuitry. As another non-limiting example, the DAC 104 can comprise any suitable digital signal processing circuitry which can up-sample, down-sample, filter, or otherwise manipulate a digital input signal that is to be converted by the DAC 104. For instance, such digital signal processing circuitry can include fixed-point digital signal processing circuitry or floating-point digital signal processing circuitry. As another non-limiting example, the DAC 104 can comprise any suitable analog core circuitry which can electronically convert a digital input signal received by the DAC 104 into a corresponding analog output signal (e.g., into a corresponding continuously-varying voltage or current). For instance, such analog core circuitry can include binary weighted analog core circuitry, R-2R ladder analog core circuitry, delta-sigma analog core circuitry, multibit analog core, successive approximation analog core circuitry, pulse width modulation (PWM) analog core circuitry, or segmented analog core circuitry. As another non-limiting example, the DAC 104 can comprise any suitable analog signal processing circuitry which can attenuate, amplify, or otherwise manipulate an analog output signal produced by the DAC 104. For instance, such analog signal processing circuitry can include op-amps, high-pass filters, low-pass filters, intermediate-pass filters, modulators, demodulators, or envelope detectors.

No matter its construction, design, or architecture, the DAC 104 can, in various aspects, electronically receive as input the digital amplitude indicator sequence 106 and electronically generate as output an analog waveform 108. In other words, the DAC 104 can electronically convert the digital amplitude indicator sequence 106 into the analog waveform 108. Non-limiting aspects are described with respect to FIG. 2.

Figure 2:
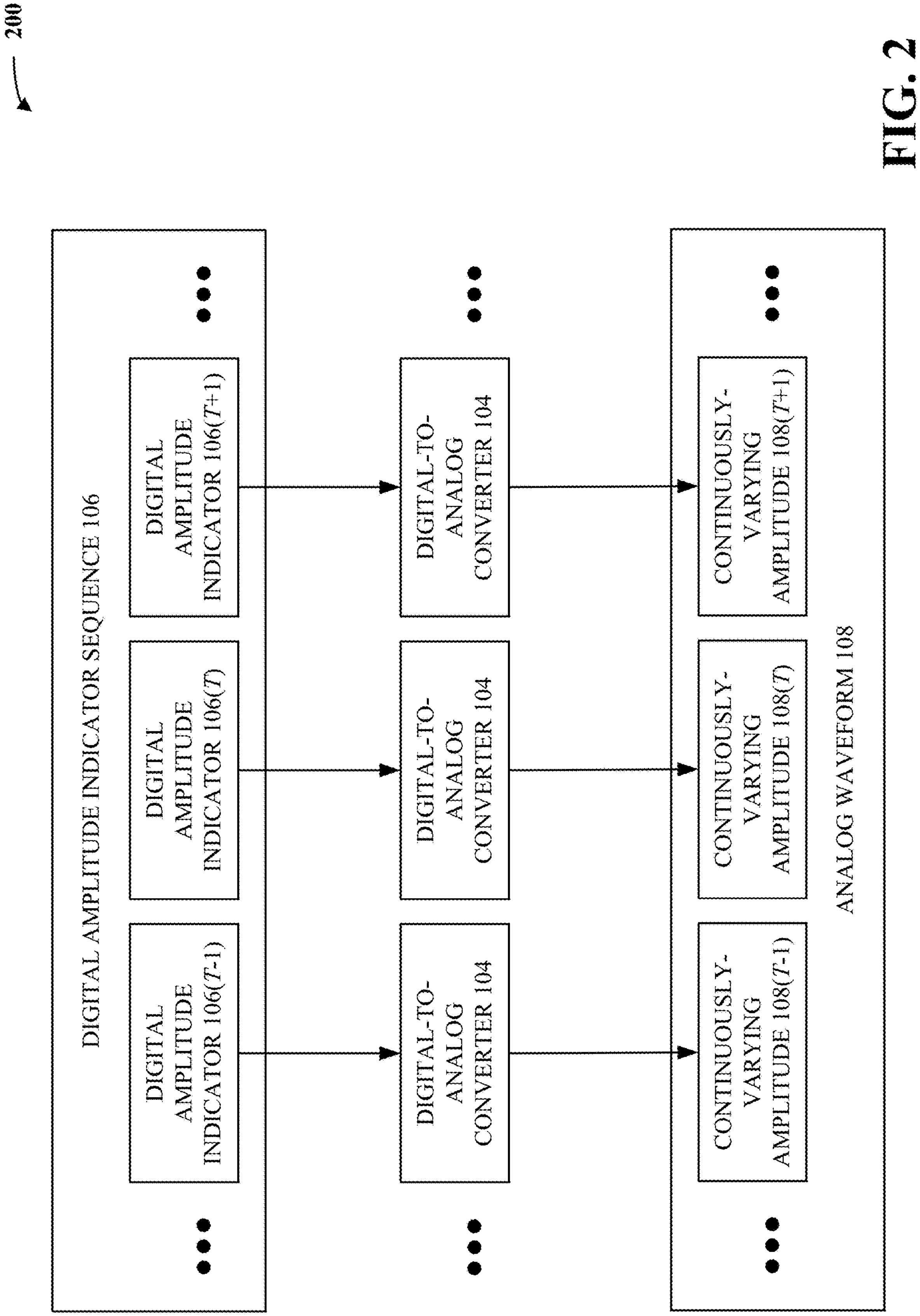
FIG. 2 illustrates an example, non-limiting block diagram showing how a digital amplitude indicator sequence can be converted into an analog waveform in accordance with one or more embodiments described herein.

FIG. 2 illustrates an example, non-limiting block diagram 200 showing how the digital amplitude indicator sequence 106 can be converted into the analog waveform 108 in accordance with one or more embodiments described herein.

In various embodiments, the digital amplitude indicator sequence 106 can be a stream or time-series of digital amplitude indicators. In various aspects, a digital amplitude indicator can be any suitable bit-string of any suitable length (e.g., made up of any suitable number of bits) which can represent, convey, or otherwise indicate an amplitude value that is to be converted into a corresponding or associated analog format by the DAC 104. In various instances, each digital amplitude indicator in the digital amplitude indicator sequence 106 can have the same length (e.g., the same number of bits) as each other. In various cases, the digital amplitude indicator sequence 106 can be considered as a time-series of digital amplitude indicators, with a new or most recent digital amplitude indicator being added to the digital amplitude indicator sequence 106 at each time-step.

As a non-limiting example, consider a time-step, for any suitable positive integer t>1. Note that any suitable number of time-steps can be contained within or otherwise make up one second of time (e.g., one second of time can contain thousands, millions, or even billions of time-steps). In any case, the digital amplitude indicator sequence 106 can comprise a digital amplitude indicator 106($t$). In various aspects, the digital amplitude indicator 106($t$) can be whatever digital amplitude indicator is newly added or appended to the digital amplitude indicator sequence 106 at the time-step t. Furthermore, in such case, the digital amplitude indicator sequence 106 can comprise a digital amplitude indicator 106($t-1$). In various instances, the digital amplitude indicator 106($t-1$) can be whatever digital amplitude indicator was newly added or appended to the digital amplitude indicator sequence 106 at the time-step t−1 (e.g., at the immediately preceding time-step). Further still, in such case, the digital amplitude indicator sequence 106 can comprise a digital amplitude indicator 106($t+1$). In various instances, the digital amplitude indicator 106($t+1$) can be whatever digital amplitude indicator was newly added or appended to the digital amplitude indicator sequence 106 at the time-step t+1 (e.g., at the immediately succeeding time-step).

In various aspects, the DAC 104 can electronically generate the analog waveform 108, by successively or sequentially converting each digital amplitude indicator of the digital amplitude indicator sequence 106 into a corresponding or associated continuously-varying amplitude of the analog waveform 108. In various instances, this can be accomplished by sequentially passing, in chronological order, respective digital amplitude indicators through whatever circuitry makes up the DAC 104.

As a non-limiting example, the digital amplitude indicator 106($t-1$) can pass through the DAC 104, thereby yielding a continuously-varying amplitude 108($t-1$). More specifically, the digital amplitude indicator 106($t-1$) can pass through, and thereby be incrementally manipulated by, whatever digital input interface circuitry the DAC 104 has, whatever digital signal processing circuitry the DAC 104 has, whatever analog core circuitry the DAC 104 has, and whatever analog signal processing circuitry the DAC 104 has. Such pass-through can cause the DAC 104 to produce or otherwise output a continuously-varying electric voltage or a continuously-varying electric current whose instantaneous amplitude (e.g., whose amplitude at the (t−1)-th time-step) can be referred to as the continuously-varying amplitude 108($t-1$). Note that the continuously-varying amplitude 108($t-1$) can depend upon whatever amplitude value is conveyed by the digital amplitude indicator 106($t-1$). Indeed, in some cases, the continuously-varying amplitude 108($t-1$) can be equal to whatever amplitude value is conveyed by the digital amplitude indicator 106($t-1$) (e.g., in such cases, the DAC 104 can be considered as directly converting the digital amplitude indicator 106($t-1$) into an analog format). However, in other cases, the continuously-varying amplitude 108($t-1$) can be unequal to, but nevertheless based on, whatever amplitude value is conveyed by the digital amplitude indicator 106($t-1$) (e.g., the DAC 104 can additively or multiplicatively mix any suitable internally-generated amplitude value with the digital amplitude indicator 106($t-1$), and the DAC 104 can be considered as converting the result of that mixing into an analog format).

As another non-limiting example, the digital amplitude indicator 106($t$) can pass through the DAC 104, thereby yielding a continuously-varying amplitude 108($t$). In particular, the digital amplitude indicator 106($t$) can pass through, and thereby be incrementally manipulated by, whatever circuitry (e.g., digital input interface circuitry, digital signal processing circuitry, analog core circuitry, analog signal processing circuitry) the DAC 104 has, thereby causing the DAC 104 to produce or otherwise output a continuously-varying electric voltage or a continuously-varying electric current whose instantaneous amplitude (e.g., whose amplitude at the t-th time-step) can be referred to as the continuously-varying amplitude 108($t$). As above, the continuously-varying amplitude 108($t$) can depend upon whatever amplitude value is conveyed by the digital amplitude indicator 106($t$) (e.g., in non-mixing situations, the continuously-varying amplitude 108($t$) can be equal to the amplitude value conveyed by the digital amplitude indicator 106($t$); in mixing situations, the continuously-varying amplitude 108($t$) can instead be unequal to the amplitude value conveyed by the digital amplitude indicator 106($t$)).

As yet another non-limiting example, the digital amplitude indicator 106($t+1$) can pass through the DAC 104, thereby yielding a continuously-varying amplitude 108($t+1$). Specifically, the digital amplitude indicator 106($t+1$) can pass through, and thereby be incrementally manipulated by, whatever circuitry (e.g., digital input interface circuitry, digital signal processing circuitry, analog core circuitry, analog signal processing circuitry) the DAC 104 has, thereby causing the DAC 104 to produce or otherwise output a continuously-varying electric voltage or a continuously-varying electric current whose instantaneous amplitude (e.g., whose amplitude at the (t+1)-th time-step) can be referred to as the continuously-varying amplitude 108($t+1$). As above, the continuously-varying amplitude 108($t+1$) can depend upon whatever amplitude value is conveyed by the digital amplitude indicator 106($t+1$) (e.g., in non-mixing situations, the continuously-varying amplitude 108($t+1$) can be equal to the amplitude value conveyed by the digital amplitude indicator 106($t+1$); in mixing situations, the continuously-varying amplitude 108($t+1$) can instead be unequal to the amplitude value conveyed by the digital amplitude indicator 106($t+1$)).

In this way, the DAC 104 can electronically generate the analog waveform 108 based on the digital amplitude indicator sequence 106.

In various aspects, the DAC 104 can have, implement, or otherwise be associated with any suitable clock cycle that governs how frequently the DAC 104 converts digital amplitude values into corresponding analog formats. In various instances, a clock cycle can correspond to or otherwise contain one or more time-steps (e.g., one second of time can contain thousands, millions, or even billions of clock cycles). Accordingly, during each clock cycle, one or more digital amplitude indicators can be newly added to the digital amplitude indicator sequence 106, and the DAC 104 can convert those one or more newly-added digital amplitude indicators into corresponding analog amplitudes.

Referring back to FIG. 1, it can be desired to provide at-speed or real-time control of the DAC 104. In other words, it can be desired to alter or otherwise modify the performance, operation, or functionality of the DAC 104 during or while the DAC 104 converts the digital amplitude indicator sequence 106 into the analog waveform 108. As described herein, the amplitude-driven control system 102 can facilitate or accomplish such objective.

In various embodiments, the amplitude-driven control system 102 can comprise a processor 110 (e.g., computer processing unit, microprocessor) and a non-transitory computer-readable memory 112 that is operably connected or coupled to the processor 110. The memory 112 can store computer-executable instructions which, upon execution by the processor 110, can cause the processor 110 or other components of the amplitude-driven control system 102 (e.g., access component 114, monitor component 116, reset component 118) to perform one or more acts. In various embodiments, the memory 112 can store computer-executable components (e.g., access component 114, monitor component 116, reset component 118), and the processor 110 can execute the computer-executable components.

In various embodiments, the amplitude-driven control system 102 can comprise an access component 114. In various aspects, the access component 114 can electronically access the DAC 104. That is, the access component 114 can electronically communicate or otherwise electronically interact with (e.g., transmit electronic instructions or commands to, receive electronic data from) the DAC 104. Accordingly, the access component 114 can be considered as a proxy or conduit through which other components of the amplitude-driven control system 102 can interact with, communicate with, or otherwise manipulate the DAC 104. In various instances, the access component 114 can electronically access the digital amplitude indicator sequence 106. That is, the access component 114 can electronically receive, electronically retrieve, or otherwise electronically obtain the digital amplitude indicator sequence 106, from any suitable electronic source or database. In any case, the access component 114 can be considered as a proxy or conduit through which other components of the amplitude-driven control system 102 can interact with, control, or otherwise manipulate the digital amplitude indicator sequence 106. However, these are mere non-limiting examples. In other cases, the access component 114 can be omitted, and any other components of the amplitude-driven control system 102 can communicate or interact directly with the DAC 104 or with the digital amplitude indicator sequence 106.

In various embodiments, the amplitude-driven control system 102 can comprise a monitor component 116. In various aspects, the monitor component 116 can, as described herein, electronically monitor the digital amplitude indicator sequence 106, in search for a defined subsequence of digital amplitude indicators.

In various embodiments, the amplitude-driven control system 102 can comprise a reset component 118. In various instances, the reset component 118 can, as described herein, electronically reset any suitable operational characteristic of the DAC 104, in response to detection of the defined subsequence of digital amplitude indicators.

Note that, in various instances, the access component 114, the monitor component 116, and the reset component 118 can collectively be considered as being one or more software components 113 of the amplitude-driven control system 102. In various aspects, it should be appreciated that the one or more software components 113 are described primarily herein as comprising three components (e.g., the access component 114, the monitor component 116, and the reset component 118) for case of explanation and illustration. However, the one or more software components 113 are not limited to being implemented as exactly such three components in every embodiment. Indeed, in some embodiments, the functionalities described herein of such three components can be combined in any suitable fashions, so as to be implemented in or by fewer than three components (e.g., in some cases, a single component can perform all of the functionalities that are described herein with respect to the access component 114, the monitor component 116, and the reset component 118). In other embodiments, the functionalities described herein of such three components can instead be distributed, separated, split, or fragmented in any suitable fashions, so as to be implemented in or by more than three components (e.g., two or more components can facilitate the functionalities that are performable by the access component 114; two or more components can facilitate the functionalities that are performable by the monitor component 116; two or more components can facilitate the functionalities that are performable by the reset component 118).

Figure 3:
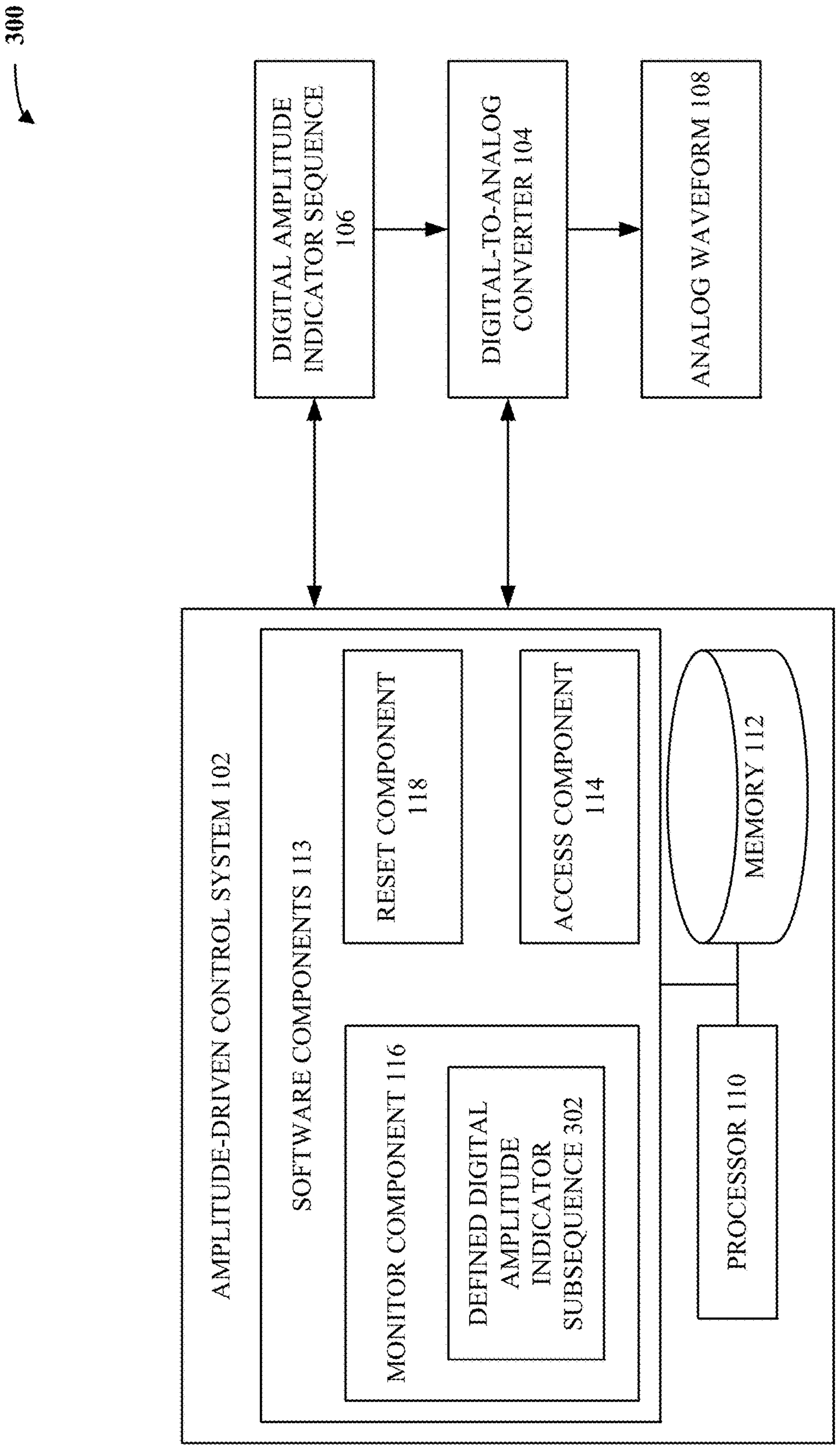
FIG. 3 illustrates a block diagram of an example, non-limiting system including a defined digital amplitude indicator subsequence that facilitates amplitude-driven at-speed control of digital-to-analog converters in accordance with one or more embodiments described herein.

FIG. 3 illustrates a block diagram of an example, non-limiting system 300 including a defined digital amplitude indicator subsequence that can facilitate amplitude-driven at-speed control of digital-to-analog converters in accordance with one or more embodiments described herein. As shown, the system 300 can, in some cases, comprise the same components as the system 100, and can further comprise a defined digital amplitude indicator subsequence 302.

In various embodiments, the monitor component 116 can electronically monitor, electronically surveil, or otherwise electronically read the digital amplitude indicator sequence 106, in search for the defined digital amplitude indicator subsequence 302. Non-limiting aspects are described with respect to FIG. 4.

FIG. 4 illustrates an example, non-limiting block diagram 400 showing how the defined digital amplitude indicator subsequence 302 can be detected in accordance with one or more embodiments described herein.

In various embodiments, as shown, the defined digital amplitude indicator subsequence 302 can be any suitable ordered sequence, chain, or list that comprises n digital amplitude indicators, for any suitable positive integer $n>1$: a digital amplitude indicator 302(1) to a digital amplitude indicator 302(*n*). In various aspects, different digital amplitude indicators in the defined digital amplitude indicator subsequence 302 can convey or represent the same or different amplitude values as each other. As a non-limiting example, the digital amplitude indicator 302(1) can be a first bit-string that indicates a first amplitude value which may or may not be equal or equivalent to any other amplitude value represented in the defined digital amplitude indicator subsequence 302. As another non-limiting example, the digital amplitude indicator 302(*n*) can be an n-th bit-string that indicates an n-th amplitude value which may or may not be equal or equivalent to any other amplitude value represented in the defined digital amplitude indicator subsequence 302.

In any case, the monitor component 116 can search for the defined digital amplitude indicator subsequence 302 within the digital amplitude indicator sequence 106, while or concurrently as the digital amplitude indicator sequence 106 is received by the DAC 104. In other words, the monitor component 116 can read or record whatever digital amplitude indicator is newly added to the digital amplitude indicator sequence 106 at each time-step, and the monitor component 116 can generate an electronic alert when the n most-recently added digital amplitude indicators match the defined digital amplitude indicator subsequence 302.

As a more specific non-limiting example, the monitor component 116 can perform or facilitate a computer-implemented method 402.

In various embodiments, act 404 of the computer-implemented method 402 can include generating an electronic alert or notification that signals or conveys that the defined digital amplitude indicator subsequence 302 is not detected or found.

In various aspects, act 406 of the computer-implemented method 402 can include initializing a dummy variable i to be equal to 1.

In various instances, act 408 of the computer-implemented method 402 can include proceeding to a next or following time-step (e.g., proceeding from time-step t to time-step t+1). Note that such next or following time-step can now be considered as a current or present time-step.

In various cases, act 410 of the computer-implemented method 402 can include accessing a current, most recent, or present time-step digital amplitude indicator in the digital amplitude indicator sequence 106.

In various instances, act 412 of the computer-implemented method 402 can include determining whether that current, most recent, or present time-step digital amplitude indicator matches or is otherwise equivalent to a digital amplitude indicator 302(*i*) from the defined digital amplitude indicator subsequence 302. If not (e.g., if that current, most recent, or present time-step digital amplitude indicator and the digital amplitude indicator 302(*i*) are different or indicate non-identical amplitude values), the computer-implemented method 402 can proceed back to act 404. If so (e.g., if that current, most recent, or present time-step digital amplitude indicator and the digital amplitude indicator 302(*i*) are the same or indicate identical amplitude values), the computer-implemented method 402 can instead proceed to act 414.

In various cases, act 414 of the computer-implemented method 402 can include determining whether i is equal to n. If not (e.g., if i≠n), the computer-implemented method 402 can proceed to act 416. If so (e.g., if i=n), the computer-implemented method 402 can instead proceed to act 418.

In various aspects, act 416 of the computer-implemented method 402 can include incrementing i by 1 (e.g., i:=i+1). The computer-implemented method 402 can then proceed back to act 408.

In various aspects, act 418 of the computer-implemented method 402 can include generating an alert or notification that signals or conveys that the defined digital amplitude indicator subsequence 302 is detected or found. In various instances, the computer-implemented method 402 can proceed back to act 408.

Note that, according to the computer-implemented method 402, the monitor component 116 can be considered as continually generating a "not-detected" alert or notification, until the n digital amplitude indicators that have been most recently added to the digital amplitude indicator sequence 106 respectively match the defined digital amplitude indicator subsequence 302. At that point, the monitor component 116 can replace the "not-detected" alert or notification with a "detected" alert or notification. Furthermore, according to the computer-implemented method 402, the monitor component 116 can continually generate the "detected" alert or notification until the digital amplitude indicator that has been most recently added to the digital amplitude indicator sequence 106 no longer matches the digital amplitude indicator 302(*n*). At that point, the monitor component 116 can replace the "detected" alert or notification with the "not-detected" alert or notification, and various of the above acts can repeat as shown.

Figure 5:
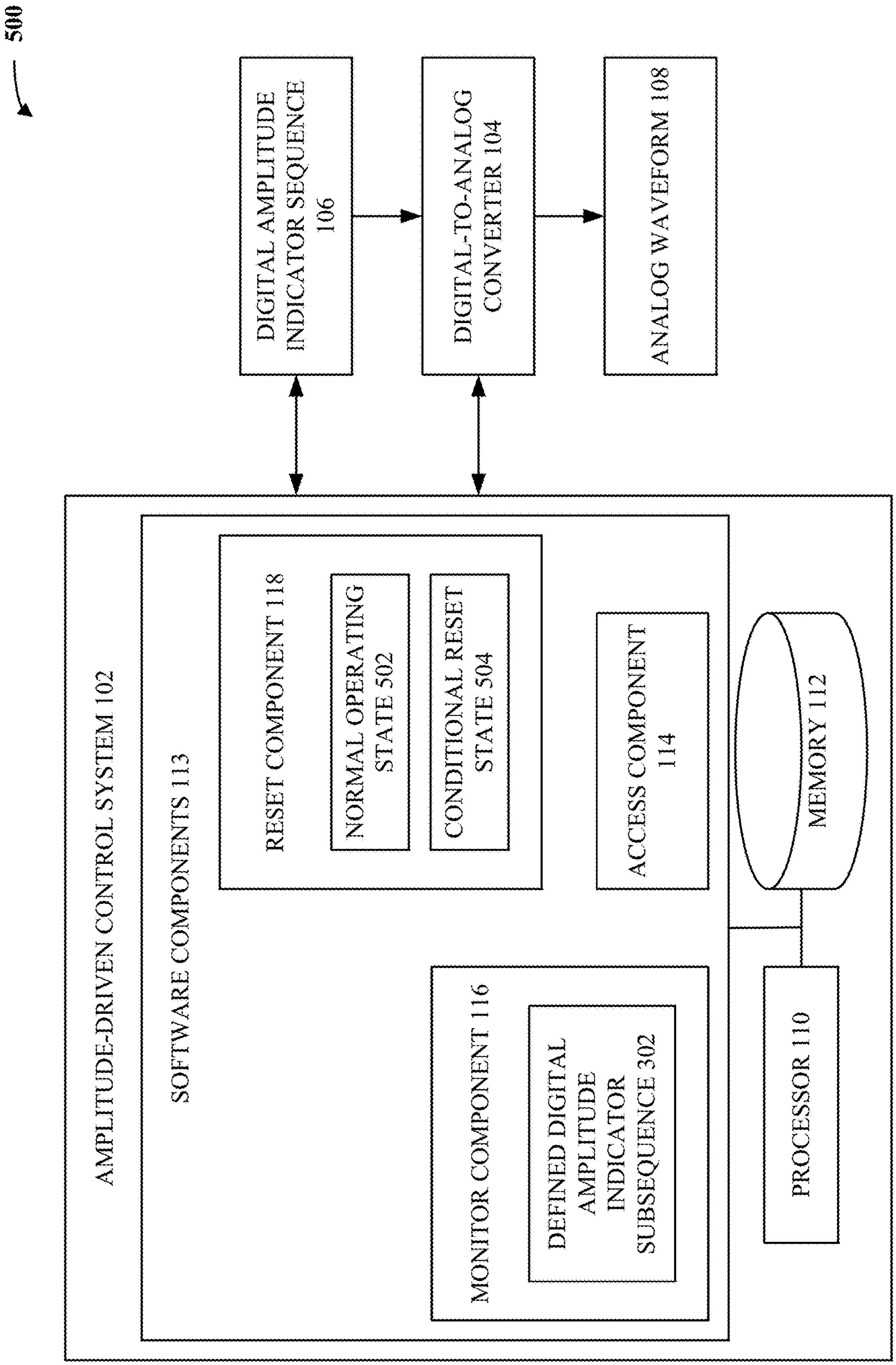
FIG. 5 illustrates a block diagram of an example, non-limiting system including a normal operating state and a conditional reset state that facilitates amplitude-driven at-speed control of digital-to-analog converters in accordance with one or more embodiments described herein.

FIG. 5 illustrates a block diagram of an example, non-limiting system 500 including a normal operating state and a conditional reset state that can facilitate amplitude-driven at-speed control of digital-to-analog converters in accordance with one or more embodiments described herein. As shown, the system 500 can, in some cases, comprise the same components as the system 300, and can further comprise a normal operating state 502 and a conditional reset state 504.

In various embodiments, the DAC 104 can comprise any suitable operational characteristic that can, at any given time, be controlled so as to take on or be in one of the normal operating state 502 and the conditional reset state 504. In various aspects, the normal operating state 502 can be a running, powered-on, or active state of the operational characteristic, whereas the conditional reset state 504 can instead be a paused, powered-down, or inactive state of the operational characteristic. In other words, the normal operating state 502 and the conditional reset state 504 can be considered as being mutually exclusive (e.g., the operational characteristic cannot occupy both states at the same time). As some non-limiting examples, the operational characteristic can be operation of any suitable part or portion of the DAC 104, such as operation of the digital input interface circuitry of the DAC 104, operation of the digital signal processing circuitry of the DAC 104, operation of the analog core circuitry of the DAC 104, or operation of the analog signal processing circuitry of the DAC 104.

In any case, the reset component 118 can electronically instruct, electronically command, or otherwise electronically cause the operational characteristic of the DAC 104 to be in the normal operating state 502, in response to the monitor component 116 indicating that the defined digital amplitude indicator subsequence 302 is not detected. Conversely, the reset component 118 can electronically instruct, electronically command, or otherwise electronically cause the operational characteristic of the DAC 104 to be in the conditional reset state 504, in response to the monitor component 116 indicating that the defined digital amplitude indicator subsequence 302 is detected. In other words, the conditional reset state 504 can be conditioned on detection of the defined digital amplitude indicator subsequence 302, hence the term "conditional". Accordingly, the defined digital amplitude indicator subsequence 302 can, in some cases, be considered as a defined pattern of bit-strings that serves a dual purpose or dual functionality: it represents incoming digital amplitude indicators that are to be converted by the DAC 104; and it simultaneously represents a reset command of the operational characteristic of the DAC 104. Contrast this with a dedicated or standalone reset key, which would instead represent a reset command without simultaneously representing digital amplitude indicators that are to be converted by the DAC 104.

In various aspects, implementation of the conditional reset state 504 can be beneficial to the analog waveform 108. Indeed, implementation of the conditional reset state 504 can cause characteristics (e.g., frequency, phase, or amplitude) of the analog waveform 108 to remain fresh or to otherwise be maintained or preserved at their respective desired values. As a specific, non-limiting example, the DAC 104 can generate the analog waveform 108 by mixing the digital amplitude indicator sequence 106 with an internally-generated waveform produced by an NCO of the DAC 104. In such case, operation of the NCO can be treated as the operational characteristic of the DAC 104. In various instances, placing the NCO of the DAC 104 into the conditional reset state 504 can cause a phase of the analog waveform 108 with respect to the digital amplitude indicator sequence 106 to remain consistent across various clock cycles of the DAC 104, even in situations where the frequency of the NCO is not an integer multiple of the clock cycle. Various non-limiting aspects are described with respect to FIGS. 6-9.

FIGS. 6-9 illustrate example, non-limiting block diagrams 600, 700, 800, and 900 showing how amplitude-driven at-speed control of digital-to-analog converters can be applied to improve control of a quantum computer in accordance with one or more embodiments described herein.

Figure 6:
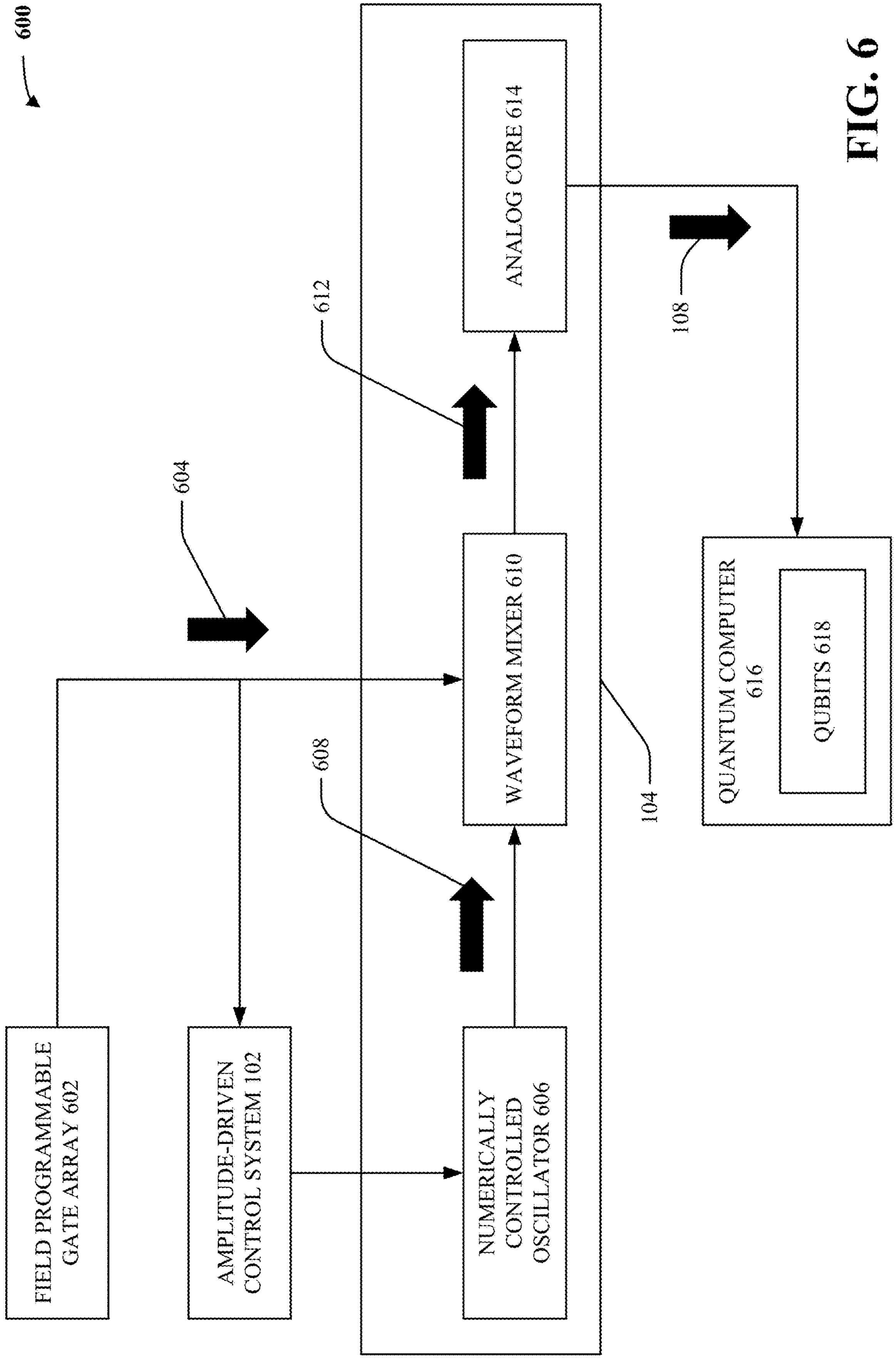
FIGS. 6-9 illustrate example, non-limiting block diagrams showing how amplitude-driven at-speed control of digital-to-analog converters can be applied to improve control of a quantum computer in accordance with one or more embodiments described herein.

First, consider FIG. 6. In various embodiments, the DAC 104 can be downstream of a field programmable gate array 602 (hereafter "FPGA 602"). In various aspects, the FPGA 602 can exhibit or otherwise have any suitable construction, architecture, or design. As some non-limiting examples, the FPGA 602 can be any of the following: a static random access memory (SRAM)-based FPGA; an antifuse-based FPGA; a flash-based FPGA; an electrically erasable programmable read-only memory (EEPROM)-based FPGA; a mixed-signal FPGA; a system-on-chip (SoC) FPGA; a high-density FPGA; a low-power FPGA; or a complex programmable logic device (CPLD)-based FPGA. No matter its specific construction or architecture, the FPGA 602 can electronically generate or otherwise produce the digital amplitude indicator sequence 106. In other words, the FPGA 602 can be considered as a digital oscillator that can generate digital representations of any suitable baseband waveform 604, where the baseband waveform 604 can be any suitable sinusoidal or non-sinusoidal signal exhibiting any suitable frequency, phase, or amplitude, and the digital amplitude indicator sequence 106 can be considered as being, conveying, or otherwise representing the instantaneous amplitude values of the baseband waveform 604.

In various aspects, the DAC 104 can comprise a numerically controlled oscillator 606 (hereafter "NCO 606"). In various instances, the NCO 606 can exhibit or otherwise have any suitable construction, architecture, or design. As a non-limiting example, the NCO 606 can comprise any suitable type of phase accumulator, such as a binary phase accumulator, a linear phase accumulator, a coordinate rotation digital computer (CORDIC) phase accumulator, a delta-sigma phase accumulator, an arctangent phase accumulator, or a fractional-n phase accumulator. As another non-limiting example, the NCO 606 can comprise any suitable type of phase-to-amplitude converter, such as a phase-to-amplitude lookup-table. No matter its specific construction or architecture, the NCO 606 can electronically generate or otherwise produce digital representations of an internal waveform 608, which can be any suitable sinusoidal or non-sinusoidal signal exhibiting any suitable frequency, phase, or amplitude.

Figure 7:
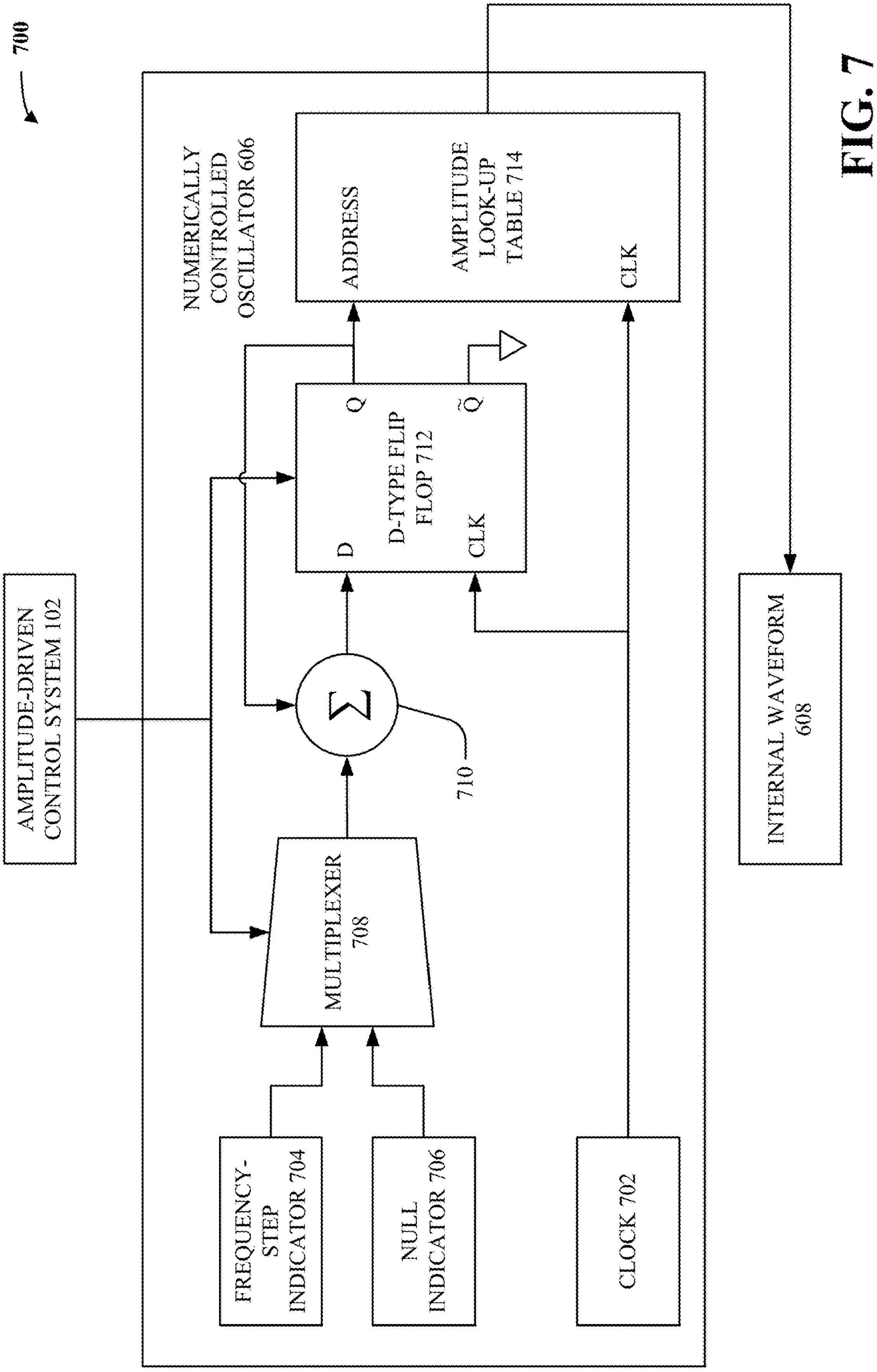

For a more specific, non-limiting example embodiment of the NCO 606, consider FIG. 7. In particular, FIG. 7 can be considered as a non-limiting circuit diagram of the NCO 606.

In various embodiments, the clock cycle of the DAC 104 can be generated by any suitable clock 702. In various aspects, the NCO 606 can comprise a phase accumulator and an amplitude look-up table 714. In various instances, the phase-accumulator of the NCO 606 can comprise a frequency-step indicator 704, a null indicator 706, a multiplexer 708, a summation circuit 710, and a D-type flip flop 712. In various cases, the frequency-step indicator 704 can be any suitable bit-string that represents or otherwise conveys a frequency-step input or frequency control word of the NCO 606. In various aspects, the null indicator 706 can be a bit-string having the same length as the frequency-step indicator 704, but each bit in the null indicator 706 can be a zero, hence the term "null". In various instances, the frequency-step indicator 704 and the null indicator 706 can be received as parallel inputs by the multiplexer 708 at each time-step. In various cases, in the current or present time-step, the multiplexer 708 can selectively pass either the frequency-step indicator 704 or the null indicator 706, but not both, to the summation circuit 710. In various aspects, the summation circuit 710 can add, during the current or present time-step, the output of the multiplexer 708 to whatever output (e.g., denoted by "Q") was produced by the D-type flip flop 712 during the preceding or previous time-step. In various instances, the output of the summation circuit 710 during the current or present time-step can then be fed as input (e.g., denoted by "D") to the D-type flip flop 712. In various cases, the D-type flip flop 712 can allow the output of the summation circuit 710 to pass through to the amplitude look-up table 714 one or more times per cycle of the clock 702 (e.g., with the leading edge of the clock 702, or with the falling edge of the clock 702). In various aspects, the amplitude look-up table 714 can, one or more times per cycle of the clock 702, identify whatever amplitude value corresponds or is otherwise mapped to the output of the D-type flip flop 712. Such amplitude values can be considered as instantaneous digital representations of the internal waveform 608.

Referring back to FIG. 6, the DAC 104 can comprise a waveform mixer 610. In various aspects, the waveform mixer 610 can exhibit or otherwise have any suitable construction, architecture, or design. As some non-limiting examples, the waveform mixer 610 can be any suitable additive mixing circuitry or any suitable multiplicative mixing circuitry. No matter its specific construction or architecture, the waveform mixer 610 can electronically combine or mix the digital representations of the baseband waveform 604 with the digital representations of the internal waveform 608. Whatever digital representations result from such combining or mixing can be referred to as mixed digital representations 612.

In various aspects, the DAC 104 can comprise an analog core 614. In various instances, the analog core 614 can exhibit or otherwise have any suitable construction, architecture, or design. As some non-limiting examples, the analog core 614 can be any suitable binary weighted analog core circuitry, any suitable R-2R ladder analog core circuitry, or any suitable delta-sigma analog core circuitry. No matter its specific construction or architecture, the analog core 614 can electronically convert the mixed digital representations 612 into the analog waveform 108 (e.g., into a continuously-varying electric voltage or a continuously-varying electric current).

In various cases, a quantum computer 616 can be downstream of the DAC 104. In various aspects, the quantum computer 616 can be any suitable quantum computing device or quantum computing hardware. In various instances, the quantum computer 616 can comprise a set of qubits 618. In various instances, the set of qubits 618 can comprise any suitable number of qubits exhibiting any suitable structure or architecture. As a non-limiting example, any of such qubits can exhibit a superconducting qubit architecture (e.g., such qubit can be constructed from any suitable number of Josephson junctions shunted by any suitable number of planar capacitor pads). As another non-limiting example, any of such qubits can exhibit a quantum dot architecture. As yet another non-limiting example, any of such qubits can exhibit a spin qubit architecture. In various aspects, different qubits of the set of qubits 618 can exhibit the same or different structures or architectures as each other. In various instances, any given qubit of the set of qubits 618 can be exposed to or otherwise driven by the analog waveform 108. Accordingly, the quantum state of that give qubit can undergo any suitable quantum operation or quantum gate, where such operation or gate can depend upon the frequency or phase of the analog waveform 108.

In various aspects, as mentioned above, the conditionally resettable operational characteristic of the DAC 104 can be the operation of the NCO 606. More specifically, the amplitude-driven control system 102 (e.g., the monitor component 116) can electronically monitor the digital representations of the baseband waveform 604 (e.g., the digital amplitude indicator sequence 106), in search of the defined digital amplitude indicator subsequence 302. At each time-step in which the defined digital amplitude indicator subsequence 302 is not found, the amplitude-driven control system 102 (e.g., the reset component 118) can cause the NCO 606 to be in the normal operating state 502. In various cases, the amplitude-driven control system 102 can accomplish this by: causing the multiplexer 708 to output the frequency-step indicator 704 rather than the null indicator 706; or causing the D-type flip flop 712 to be active. On the other hand, at each time-step in which the defined digital amplitude indicator subsequence 302 is found, the amplitude-driven control system 102 (e.g., the reset component 118) can cause the NCO 606 to be in the conditional reset state 504. In various aspects, the amplitude-driven control system 102 can accomplish this by: causing the multiplexer 708 to output the null indicator 706 rather than the frequency-step indicator 704; or causing the D-type flip flop 712 to be inactive. In some cases, the defined digital amplitude indicator subsequence 302 can be n consecutive zero-amplitude indicators. That is, the NCO 606 can be placed into the conditional reset state 504, in response to the baseband waveform 604 idling for at least n consecutive time-steps. Such conditional resetting of the NCO 606 can cause the internal waveform 608 to be or remain synchronized or otherwise in-phase with the baseband waveform 604, even in situations where the internal waveform 608 has a frequency that is not an integer multiple of the clock cycle (e.g., 702) of the DAC 104. Non-limiting aspects are shown with respect to FIGS. 8 and 9.

Figure 8:
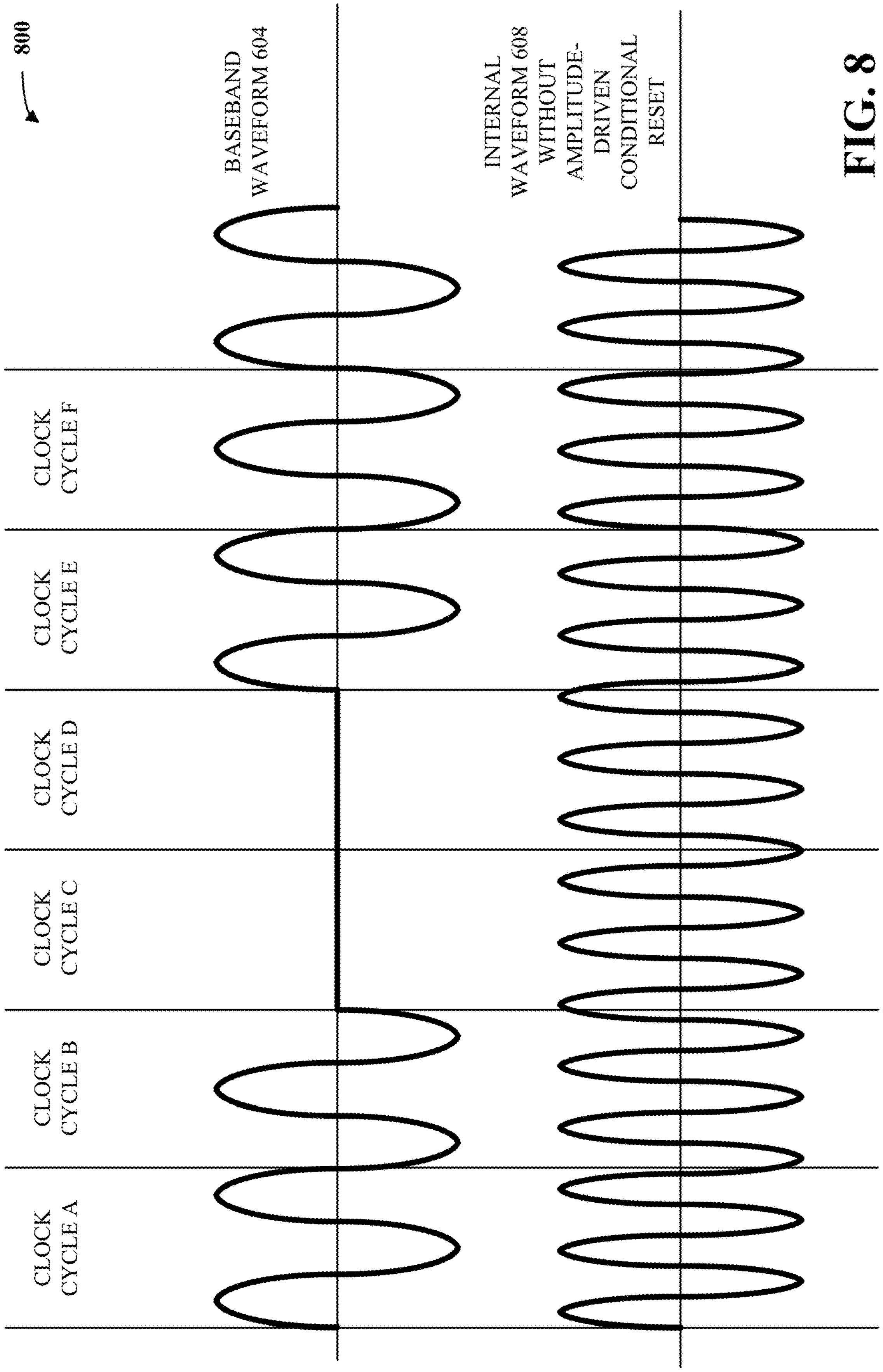

First, consider FIG. 8. As shown, the block diagram 800 of FIG. 8 depicts a non-limiting embodiment of the baseband waveform 604 and of the internal waveform 608, across six clock cycles labeled A to F, in the absence of the herein-described amplitude-driven conditional reset. In this non-limiting example, the baseband waveform 604 is a sinusoid having any suitable frequency, phase, and amplitude, where one pulse of the baseband waveform 604 occurs during the clock cycle A and the clock cycle B, and where another pulse of the baseband waveform 604 occurs during the clock cycle E and the clock cycle F. In other words, the baseband waveform 604 can be considered as idling (e.g., as having zero amplitude) during the clock cycle C and the clock cycle D. Also in this non-limiting example, the internal waveform 608 is a sinusoid having any suitable phase or amplitude, that has a frequency that is not an integer multiple of the clock cycle, and that runs continuously or continually through all of the clock cycles. Note the phase relationship that the baseband waveform 604 has with the internal waveform 608 during the clock cycle A and the clock cycle B. In particular, note that the first pulse of the baseband waveform 604 begins at the start of the period of the internal waveform 608. In contrast, note the different phase relationship that the baseband waveform 604 has with the internal waveform 608 during the clock cycle E and the clock cycle F. In particular, note that the second pulse of the baseband waveform 604 begins not at the start of the period of the internal waveform 608, but rather somewhere in the middle of the period of the internal waveform 608. Accordingly, the internal waveform 608 can be considered as being synchronized or in-time with the baseband waveform 604 during the clock cycle A and the clock cycle B, but as being unsynchronized or out-of-time with the baseband waveform 604 during the clock cycle E and the clock cycle F. Since the analog waveform 108 can be based on mixing of the baseband waveform 604 with the internal waveform 608, this difference in phase relationship can cause the analog waveform 108 to: have some desired frequency, phase, or amplitude during the clock cycle A and the clock cycle B; and have some undesired or different frequency, phase, or amplitude during the clock cycle E and the clock cycle F. In other words, this can commensurately cause any given qubit of the quantum computer 616 to undergo a desired or expected quantum gate or operation during the clock cycle A and the clock cycle B, and to instead undergo an undesired or unexpected quantum gate or operation during the clock cycle E and the clock cycle F.

Figure 9:
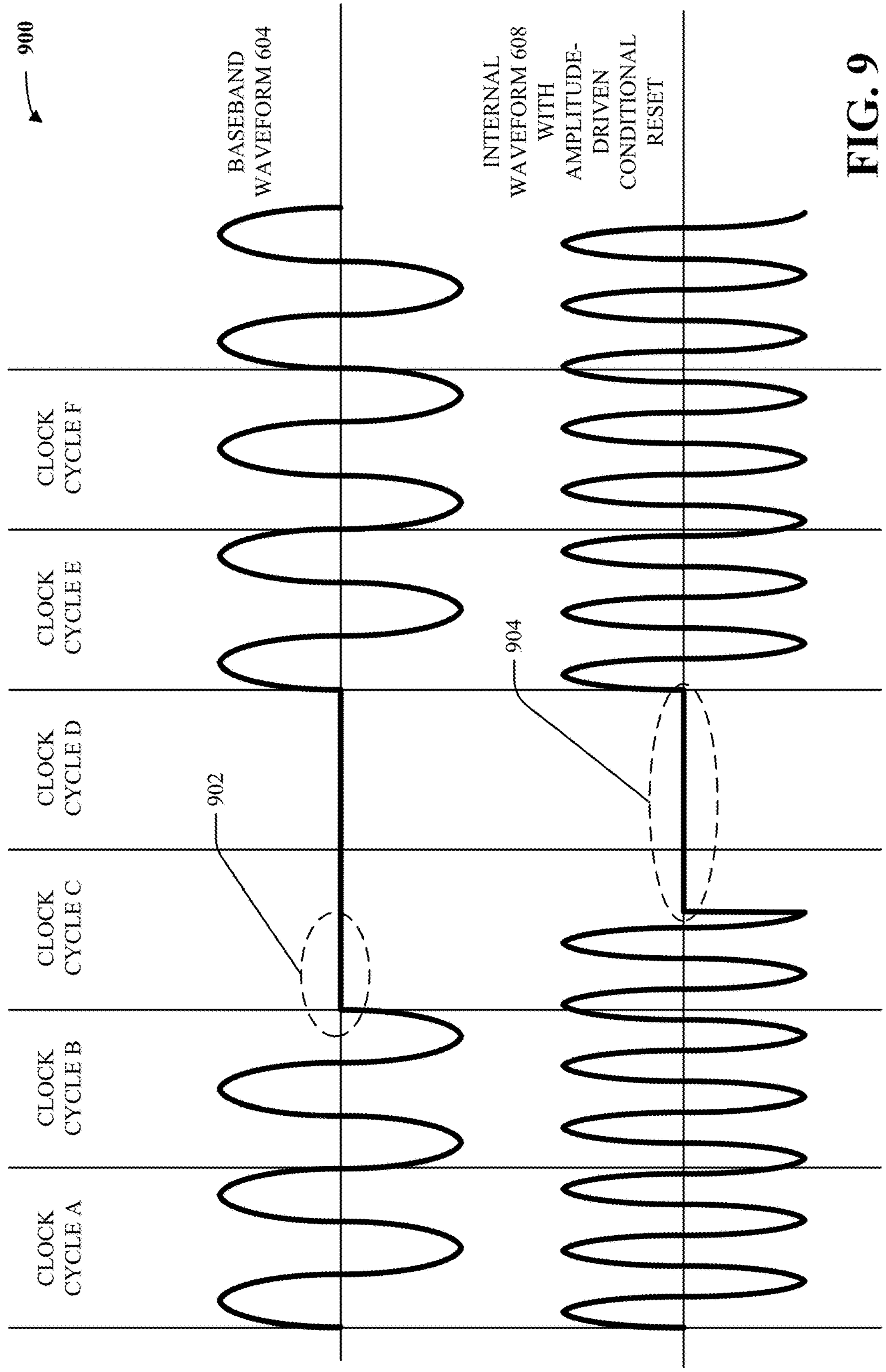

Now, consider FIG. 9. As shown, the block diagram 900 of FIG. 9 depicts a non-limiting embodiment of the baseband waveform 604 and of the internal waveform 608, across the clock cycles A to F, in the presence of the herein-described amplitude-driven conditional reset. In this non-limiting example, suppose that the defined digital amplitude indicator subsequence 302 is n consecutive amplitudes of zero-value, and suppose that a portion 902 of the baseband waveform 604 that occurs within the clock cycle C matches that defined digital amplitude indicator subsequence. In various aspects, the monitor component 116 can detect the portion 902, and the reset component 118 can respond by shifting the NCO 606 from the normal operating state 502 to the conditional reset state 504. As indicated by numeral 904, when the NCO 606 is in the conditional reset state 504, the internal waveform 608 can have zero amplitude. In various instances, the reset component 118 can keep the NCO 606 in the conditional reset state 504, until the monitor component 116 detects the next or following non-zero amplitude of the baseband waveform 604. In the non-limiting example of FIG. 9, that next or following non-zero amplitude of the baseband waveform 604 occurs at the start of the clock cycle E. Accordingly, at the start of the clock cycle E, the reset component 118 can shift the NCO 606 from the conditional reset state 504 back into the normal operating state 502, which can cause the NCO 606 to freshly begin generating the internal waveform 608 from the beginning of its period. Unlike in FIG. 8, note that both the first pulse (e.g., in the clock cycles A and B) and the second pulse (e.g., in the clock cycles E and F) of the baseband waveform 604 begin at the start of the period of the internal waveform 608. In other words, the phase relationship that the baseband waveform 604 has with the internal waveform 608 during the clock cycles A and B can be the same as or identical to the phase relationship that the baseband waveform 604 has with the internal waveform 608 during the clock cycles E and F, thanks to the herein-described conditional resetting of the NCO 606. This identical phase relationship can cause the analog waveform 108 to: have some desired frequency, phase, or amplitude during the clock cycle A and the clock cycle B; and have the same desired frequency, phase, or amplitude during the clock cycle E and the clock cycle F. In other words, this can commensurately cause any given qubit of the quantum computer 616 to undergo a desired or expected quantum gate or operation during the clock cycle A and the clock cycle B, and to undergo that same desired or expected quantum gate or operation during the clock cycle E and the clock cycle F.

As FIGS. 8-9 illustrate, various embodiments described herein can be considered as providing at-speed, real-time, or mid-session phase control of the NCO 606 and of the internal waveform 608, in situations where the frequency of the NCO 606 is not an integer multiple of the clock cycle, and without the discontinuities or wasted communication bandwidth that accompany dedicated reset key techniques. Accordingly, the amplitude-driven DAC reset of various embodiments described herein certainly constitutes a tangible and concrete technical improvement in the field of digital-to-analog converters.

FIG. 10 illustrates a flow diagram of an example, non-limiting computer-implemented method 1000 that can facilitate amplitude-driven at-speed control of digital-to-analog converters in accordance with one or more embodiments described herein. In various cases, the amplitude-driven control system 102 can facilitate or perform the computer-implemented method 1000.

In various embodiments, act 1002 can include generating, by a digital-to-analog converter (e.g., 104), an analog waveform (e.g., 108) based on a digital amplitude indicator sequence (e.g., 106).

In various aspect, act 1004 can include resetting, by a processor (e.g., via 110 or 118 of 102) coupled to the digital-to-analog converter, an operating characteristic of the digital-to-analog converter in response to detection of a defined digital amplitude indicator subsequence (e.g., 302) in the digital amplitude indicator sequence.

Although not explicitly shown in FIG. 10, the operating characteristic can be operation of a numerically controlled oscillator (e.g., 606) of the digital-to-analog converter.

Although not explicitly shown in FIG. 10, the digital amplitude indicator sequence can correspond to a baseband waveform (e.g., 604) produced by a field programmable gate array (e.g., 602).

Although not explicitly shown in FIG. 10, the digital-to-analog converter can mix (e.g., via 610) the baseband waveform with an internal waveform (e.g., 608) produced by the numerically controlled oscillator, and a core (e.g., 614) of the digital-to-analog converter can compute the analog waveform based on a result (e.g., 612) of such mixing.

Although not explicitly shown in FIG. 10, resetting the operation of the numerically controlled oscillator in response to detection of the defined digital amplitude indicator subsequence can cause a phase of the analog waveform to be synchronized with the baseband waveform, regardless of a frequency implemented by the numerically controlled oscillator (e.g., as shown by FIGS. 8-9).

Although not explicitly shown in FIG. 10, the computer-implemented method 1000 can comprise: transmitting, by the digital-to-analog converter, the analog waveform to a qubit (e.g., one of 618) of a quantum computer (e.g., 616), thereby causing the qubit to perform a quantum operation.

Although not explicitly shown in FIG. 10, a frequency implemented by the numerically controlled oscillator can be not an integer multiple of a clock frequency associated with the digital-to-analog converter.

Although not explicitly shown in FIG. 10, the defined digital amplitude indicator subsequence can be a threshold number of consecutive zero-amplitude indicators produced by the field programmable gate array.

Although various embodiments described herein involve conditionally resetting the NCO 606 of the DAC 104 in an amplitude-driven fashion, this is a mere non-limiting example for case of explanation and illustration. In various aspects, the DAC 104 can comprise any other suitable type of oscillator (e.g., a voltage controlled oscillator), and such other oscillator can be conditionally resettable in an amplitude-driven fashion as described herein.

Figure 11:
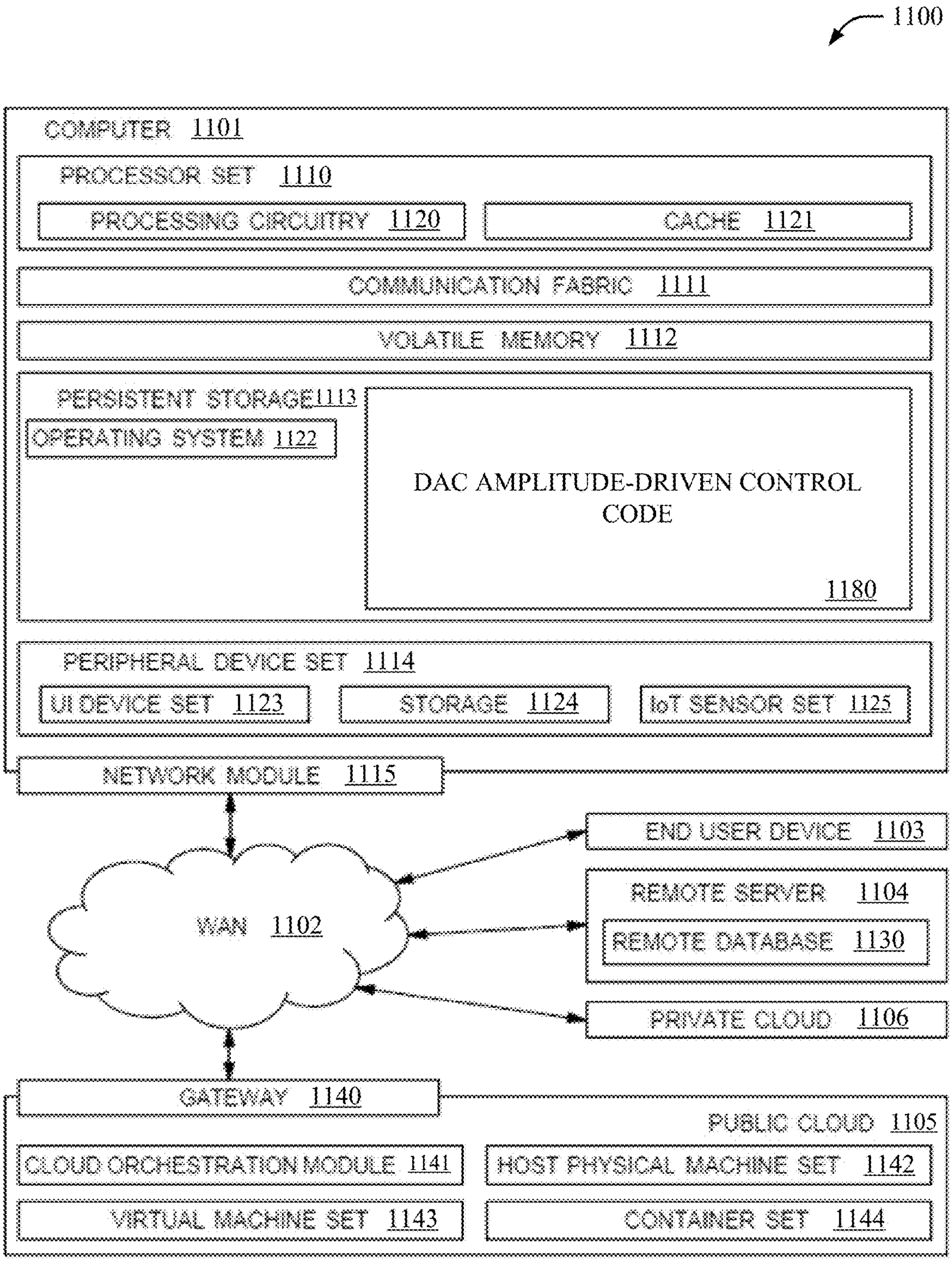
FIG. 11 illustrates a block diagram of an example, non-limiting operating environment in which one or more embodiments described herein can be facilitated.

FIG. 11 and the following discussion are intended to provide a brief, general description of a suitable computing environment 1100 in which one or more embodiments described herein can be implemented. For example, various aspects of the present disclosure are described by narrative text, flowcharts, block diagrams of computer systems or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks can be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions or data for performing computer operations specified in a given CPP claim. A "storage device" is any tangible device that can retain and store instructions for use by a computer processor. Without limitation, the computer readable storage medium can be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1100 contains an example of an environment for the execution of at least some of the computer code involved in performing the inventive methods, such as DAC amplitude-driven control code 1180. In addition to block 1180, computing environment 1100 includes, for example, computer 1101, wide area network (WAN) 1102, end user device (EUD) 1103, remote server 1104, public cloud 1105, and private cloud 1106. In this embodiment, computer 1101 includes processor set 1110 (including processing circuitry 1120 and cache 1121), communication fabric 1111, volatile memory 1112, persistent storage 1113 (including operating system 1122 and block 1180, as identified above), peripheral device set 1114 (including user interface (UI), device set 1123, storage 1124, and Internet of Things (IoT) sensor set 1125), and network module 1115. Remote server 1104 includes remote database 1130. Public cloud 1105 includes gateway 1140, cloud orchestration module 1141, host physical machine set 1142, virtual machine set 1143, and container set 1144.

COMPUTER 1101 can take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1130. As is well understood in the art of computer technology, and depending upon the technology, performance of a computer-implemented method can be distributed among multiple computers or between multiple locations. On the other hand, in this presentation of computing environment 1100, detailed discussion is focused on a single computer, specifically computer 1101, to keep the presentation as simple as possible. Computer 1101 can be located in a cloud, even though it is not shown in a cloud in FIG. 11. On the other hand, computer 1101 is not required to be in a cloud except to any extent as can be affirmatively indicated.

PROCESSOR SET 1110 includes one, or more, computer processors of any type now known or to be developed in the future. Processing circuitry 1120 can be distributed over multiple packages, for example, multiple, coordinated integrated circuit chips. Processing circuitry 1120 can implement multiple processor threads or multiple processor cores. Cache 1121 is memory that is located in the processor chip package(s) and is typically used for data or code that should be available for rapid access by the threads or cores running on processor set 1110. Cache memories are typically organized into multiple levels depending upon relative proximity to the processing circuitry. Alternatively, some, or all, of the cache for the processor set can be located "off chip." In some computing environments, processor set 1110 can be designed for working with qubits and performing quantum computing.

Computer readable program instructions are typically loaded onto computer 1101 to cause a series of operational steps to be performed by processor set 1110 of computer 1101 and thereby effect a computer-implemented method, such that the instructions thus executed will instantiate the methods specified in flowcharts or narrative descriptions of computer-implemented methods included in this document (collectively referred to as "the inventive methods"). These computer readable program instructions are stored in various types of computer readable storage media, such as cache 1121 and the other storage media discussed below. The program instructions, and associated data, are accessed by processor set 1110 to control and direct performance of the inventive methods. In computing environment 1100, at least some of the instructions for performing the inventive methods can be stored in block 1180 in persistent storage 1113.

COMMUNICATION FABRIC 1111 is the signal conduction path that allows the various components of computer 1101 to communicate with each other. Typically, this fabric is made of switches and electrically conductive paths, such as the switches and electrically conductive paths that make up busses, bridges, physical input/output ports and the like. Other types of signal communication paths can be used, such as fiber optic communication paths or wireless communication paths.

VOLATILE MEMORY 1112 is any type of volatile memory now known or to be developed in the future. Examples include dynamic type random access memory (RAM) or static type RAM. Typically, the volatile memory is characterized by random access, but this is not required unless affirmatively indicated. In computer 1101, the volatile memory 1112 is located in a single package and is internal to computer 1101, but, alternatively or additionally, the volatile memory can be distributed over multiple packages or located externally with respect to computer 1101.

PERSISTENT STORAGE 1113 is any form of non-volatile storage for computers that is now known or to be developed in the future. The non-volatility of this storage means that the stored data is maintained regardless of whether power is being supplied to computer 1101 or directly to persistent storage 1113. Persistent storage 1113 can be a read only memory (ROM), but typically at least a portion of the persistent storage allows writing of data, deletion of data and re-writing of data. Some familiar forms of persistent storage include magnetic disks and solid-state storage devices. Operating system 1122 can take several forms, such as various known proprietary operating systems or open-source Portable Operating System Interface type operating systems that employ a kernel. The code included in block 1180 typically includes at least some of the computer code involved in performing the inventive methods.

PERIPHERAL DEVICE SET 1114 includes the set of peripheral devices of computer 1101. Data communication connections between the peripheral devices and the other components of computer 1101 can be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1123 can include components such as a display screen, speaker, microphone, wearable devices (such as goggles and smart watches), keyboard, mouse, printer, touchpad, game controllers, and haptic devices. Storage 1124 is external storage, such as an external hard drive, or insertable storage, such as an SD card. Storage 1124 can be persistent or volatile. In some embodiments, storage 1124 can take the form of a quantum computing storage device for storing data in the form of qubits. In embodiments where computer 1101 is required to have a large amount of storage (for example, where computer 1101 locally stores and manages a large database) then this storage can be provided by peripheral storage devices designed for storing large amounts of data, such as a storage area network (SAN) that is shared by multiple, geographically distributed computers. IoT sensor set 1125 is made up of sensors that can be used in Internet of Things applications. For example, one sensor can be a thermometer and another sensor can be a motion detector.

NETWORK MODULE 1115 is the collection of computer software, hardware, and firmware that allows computer 1101 to communicate with other computers through WAN 1102. Network module 1115 can include hardware, such as modems or Wi-Fi signal transceivers, software for packetizing or de-packetizing data for communication network transmission, or web browser software for communicating data over the internet. In some embodiments, network control functions and network forwarding functions of network module 1115 are performed on the same physical hardware device. In other embodiments (for example, embodiments that utilize software-defined networking (SDN)), the control functions and the forwarding functions of network module 1115 are performed on physically separate devices, such that the control functions manage several different network hardware devices. Computer readable program instructions for performing the inventive methods can typically be downloaded to computer 1101 from an external computer or external storage device through a network adapter card or network interface included in network module 1115.

WAN 1102 is any wide area network (for example, the internet) capable of communicating computer data over non-local distances by any technology for communicating computer data, now known or to be developed in the future. In some embodiments, the WAN can be replaced or supplemented by local area networks (LANs) designed to communicate data between devices located in a local area, such as a Wi-Fi network. The WAN or LANs typically include computer hardware such as copper transmission cables, optical transmission fibers, wireless transmission, routers, firewalls, switches, gateway computers and edge servers.

END USER DEVICE (EUD) 1103 is any computer system that is used and controlled by an end user (for example, a customer of an enterprise that operates computer 1101) and can take any of the forms discussed above in connection with computer 1101. EUD 1103 typically receives helpful and useful data from the operations of computer 1101. For example, in a hypothetical case where computer 1101 is designed to provide a recommendation to an end user, this recommendation would typically be communicated from network module 1115 of computer 1101 through WAN 1102 to EUD 1103. In this way, EUD 1103 can display, or otherwise present, the recommendation to an end user. In some embodiments, EUD 1103 can be a client device, such as thin client, heavy client, mainframe computer or desktop computer.

REMOTE SERVER 1104 is any computer system that serves at least some data or functionality to computer 1101. Remote server 1104 can be controlled and used by the same entity that operates computer 1101. Remote server 1104 represents the machine(s) that collect and store helpful and useful data for use by other computers, such as computer 1101. For example, in a hypothetical case where computer 1101 is designed and programmed to provide a recommendation based on historical data, then this historical data can be provided to computer 1101 from remote database 1130 of remote server 1104.

PUBLIC CLOUD 1105 is any computer system available for use by multiple entities that provides on-demand availability of computer system resources or other computer capabilities, especially data storage (cloud storage) and computing power, without direct active management by the scale. The direct and active management of the computing resources of public cloud 1105 is performed by the computer hardware or software of cloud orchestration module 1141. The computing resources provided by public cloud 1105 are typically implemented by virtual computing environments that run on various computers making up the computers of host physical machine set 1142, which is the universe of physical computers in or available to public cloud 1105. The virtual computing environments (VCEs) typically take the form of virtual machines from virtual machine set 1143 or containers from container set 1144. It is understood that these VCEs can be stored as images and can be transferred among and between the various physical machine hosts, either as images or after instantiation of the VCE. Cloud orchestration module 1141 manages the transfer and storage of images, deploys new instantiations of VCEs and manages active instantiations of VCE deployments. Gateway 1140 is the collection of computer software, hardware and firmware allowing public cloud 1105 to communicate through WAN 1102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1106 is similar to public cloud 1105, except that the computing resources are only available for use by a single enterprise. While private cloud 1106 is depicted as being in communication with WAN 1102, in other embodiments a private cloud can be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, or data/application portability between the multiple constituent clouds. In this embodiment, public cloud 1105 and private cloud 1106 are both part of a larger hybrid cloud.

The embodiments described herein can be directed to one or more of a system, a method, an apparatus or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network or a wireless network. The network can comprise copper transmission cables, optical transmission fibers, wireless transmission, routers, firewalls, switches, gateway computers or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, or source code or object code written in any combination of one or more programming languages, including an object oriented programming language such as Smalltalk, C++ or the like, or procedural programming languages, such as the "C" programming language or similar programming languages. The computer readable program instructions can execute entirely on a computer, partly on a computer, as a stand-alone software package, partly on a computer or partly on a remote computer or entirely on the remote computer or server. In the latter scenario, the remote computer can be connected to a computer through any type of network, including a local area network (LAN) or a wide area network (WAN), or the connection can be made to an external computer (for example, through the Internet using an Internet Service Provider). In one or more embodiments, electronic circuitry including, for example, programmable logic circuitry, field-programmable gate arrays (FPGA) or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations or block diagrams of methods, apparatus (systems), and computer program products according to one or more embodiments described herein. It will be understood that each block of the flowchart illustrations or block diagrams, and combinations of blocks in the flowchart illustrations or block diagrams, can be implemented by computer readable program instructions. These computer readable program instructions can be provided to a processor of a general-purpose computer, special purpose computer or other programmable data processing apparatus to produce a machine, such that the instructions, which execute via the processor of the computer or other programmable data processing apparatus, can create means for implementing the functions/acts specified in the flowchart or block diagram block or blocks. These computer readable program instructions can also be stored in a computer readable storage medium that can direct a computer, a programmable data processing apparatus or other devices to function in a particular manner, such that the computer readable storage medium having instructions stored therein can comprise an article of manufacture including instructions which can implement aspects of the function/act specified in the flowchart or block diagram block or blocks. The computer readable program instructions can also be loaded onto a computer, other programmable data processing apparatus or other device to cause a series of operational acts to be performed on the computer, other programmable apparatus or other device to produce a computer implemented process, such that the instructions which execute on the computer, other programmable apparatus or other device implement the functions/acts specified in the flowchart or block diagram block or blocks.

The flowcharts and block diagrams in the figures illustrate the architecture, functionality or operation of possible implementations of systems, computer-implementable methods or computer program products according to one or more embodiments described herein. In this regard, each block in the flowchart or block diagrams can represent a module, segment or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams or flowchart illustration, or combinations of blocks in the block diagrams or flowchart illustration, can be implemented by special purpose hardware-based systems that can perform the specified functions or acts or carry out one or more combinations of special purpose hardware or computer instructions.

While the subject matter has been described above in the general context of computer-executable instructions of a computer program product that runs on a computer or computers, those skilled in the art will recognize that the one or more embodiments herein also can be implemented at least partially in parallel with one or more other program modules. Generally, program modules include routines, programs, components or data structures that perform particular tasks or implement particular abstract data types. Moreover, the aforedescribed computer-implemented methods can be practiced with other computer system configurations, including single-processor or multiprocessor computer systems, mini-computing devices, mainframe computers, as well as computers, hand-held computing devices (e.g., PDA, phone), or microprocessor-based or programmable consumer or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" or "interface" can refer to or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program or a computer. By way of illustration, both an application running on a server and the server can be a component. One or more components can reside within a process or thread of execution and a component can be localized on one computer or distributed between two or more computers. In another example, respective components can execute from various computer readable media having various data structures stored thereon. The components can communicate via local or remote processes such as in accordance with a signal having one or more data packets (e.g., data from one component interacting with another component in a local system, distributed system or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, where the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. As used herein, the term "and/or" is intended to have the same meaning as "or." Moreover, articles "a" and "an" as used in the subject specification and annexed drawings should generally be construed to mean "one or more" unless specified otherwise or clear from context to be directed to a singular form. As used herein, the terms "example" or "exemplary" are utilized to mean serving as an example, instance, or illustration. For the avoidance of doubt, the subject matter described herein is not limited by such examples. In addition, any aspect or design described herein as an "example" or "exemplary" is not necessarily to be construed as preferred or advantageous over other aspects or designs, nor is it meant to preclude equivalent exemplary structures and techniques known to those of ordinary skill in the art.

The herein disclosure describes non-limiting examples of various embodiments. For ease of description or explanation, various portions of the herein disclosure utilize the term "each", "every", or "all" when discussing various embodiments. Such usages of the term "each", "every", or "all" are non-limiting examples. In other words, when the herein disclosure provides a description that is applied to "each", "every", or "all" of some particular object or component, it should be understood that this is a non-limiting example of various embodiments, and it should be further understood that, in various other embodiments, it can be the case that such description applies to fewer than "each", "every", or "all" of that particular object or component.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches or gates, in order to optimize space usage or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) or Rambus dynamic RAM (RDRAM). Also, the described memory components of systems or computer-implemented methods herein are intended to include, without being limited to including, these or any other suitable types of memory.

What has been described above includes mere examples of systems and computer-implemented methods. It is, of course, not possible to describe every conceivable combination of components or computer-implemented methods for purposes of describing the one or more embodiments, but one of ordinary skill in the art can recognize that many further combinations or permutations of the one or more embodiments are possible. Furthermore, to the extent that the terms "includes," "has," "possesses," and the like are used in the detailed description, claims, appendices or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A system, comprising:

a digital-to-analog converter that is configured to generate an analog waveform based on a digital amplitude indicator sequence; and a processor that is configured to reset an operating characteristic of the digital-to-analog converter in response to detection of a defined digital amplitude indicator subsequence in the digital amplitude indicator sequence.

2. The system of claim 1, wherein the operating characteristic is operation of a numerically controlled oscillator of the digital-to-analog converter.

3. The system of claim 2, wherein the digital amplitude indicator sequence corresponds to a baseband waveform produced by a field programmable gate array.

4. The system of claim 3, wherein the digital-to-analog converter mixes the baseband waveform with an internal waveform produced by the numerically controlled oscillator, and wherein a core of the digital-to-analog converter computes the analog waveform based on a result of such mixing.

5. The system of claim 4, wherein resetting the operation of the numerically controlled oscillator in response to detection of the defined digital amplitude indicator subsequence causes a phase of the analog waveform to be synchronized with the baseband waveform, regardless of a frequency implemented by the numerically controlled oscillator.

6. The system of claim 4, wherein the digital-to-analog converter transmits the analog waveform to a qubit of a quantum computer, thereby causing the qubit to perform a quantum operation.

7. The system of claim 6, wherein a frequency implemented by the numerically controlled oscillator is not an integer multiple of a clock frequency associated with the digital-to-analog converter.

8. The system of claim 4, wherein the defined digital amplitude indicator subsequence is a threshold number of consecutive zero-amplitude indicators produced by the field programmable gate array.

9. A computer-implemented method, comprising:

generating, by a digital-to-analog converter, an analog waveform based on a digital amplitude indicator sequence; and resetting, by a processor coupled to the digital-to-analog converter, an operating characteristic of the digital-to-analog converter in response to detection of a defined digital amplitude indicator subsequence in the digital amplitude indicator sequence.

10. The computer-implemented method of claim 9, wherein the operating characteristic is operation of a numerically controlled oscillator of the digital-to-analog converter.

11. The computer-implemented method of claim 10, wherein the digital amplitude indicator sequence corresponds to a baseband waveform produced by a field programmable gate array.

12. The computer-implemented method of claim 11, wherein the digital-to-analog converter mixes the baseband waveform with an internal waveform produced by the numerically controlled oscillator, and wherein a core of the digital-to-analog converter computes the analog waveform based on a result of such mixing.

13. The computer-implemented method of claim 12, wherein resetting the operation of the numerically controlled oscillator in response to detection of the defined digital amplitude indicator subsequence causes a phase of the analog waveform to be synchronized with the baseband waveform, regardless of a frequency implemented by the numerically controlled oscillator.

14. The computer-implemented method of claim 12, further comprising:

transmitting, by the digital-to-analog converter, the analog waveform to a qubit of a quantum computer, thereby causing the qubit to perform a quantum operation.

15. The computer-implemented method of claim 14, wherein a frequency implemented by the numerically controlled oscillator is not an integer multiple of a clock frequency associated with the digital-to-analog converter.

16. The computer-implemented method of claim 12, wherein the defined digital amplitude indicator subsequence is a threshold number of consecutive zero-amplitude indicators produced by the field programmable gate array.

17. A computer program product for facilitating amplitude-driven at-speed control of digital-to-analog converters, the computer program product comprising a non-transitory computer-readable memory having program instructions embodied therewith, the program instructions executable by a processor to cause the processor to:

monitor a digital amplitude indicator sequence from which a digital-to-analog converter produces an analog waveform; and reset an operating characteristic of the digital-to-analog converter in response to detection of a defined digital amplitude indicator subsequence in the digital amplitude indicator sequence.

18. The computer program product of claim 17, wherein the operating characteristic is operation of a numerically controlled oscillator of the digital-to-analog converter.

19. The computer program product of claim 18, wherein the digital amplitude indicator sequence corresponds to a baseband waveform produced by a field programmable gate array.

20. The computer program product of claim 19, wherein the digital-to-analog converter mixes the baseband waveform with an internal waveform produced by the numerically controlled oscillator, wherein a core of the digital-to-analog converter computes the analog waveform based on a result of such mixing, and wherein resetting the operation of the numerically controlled oscillator in response to detection of the defined digital amplitude indicator subsequence causes a phase of the analog waveform to be synchronized with the baseband waveform, regardless of a frequency implemented by the numerically controlled oscillator.

* * * * *